(12) United States Patent  
Bollinger et al.

(10) Patent No.: US 11,569,733 B2  
(45) Date of Patent: Jan. 31, 2023

(54) LOAD CONTROL DEVICE HAVING A CLOSED-LOOP GATE DRIVE CIRCUIT INCLUDING OVERCURRENT PROTECTION

(71) Applicant: Lutron Technology Company LLC, Coopersburg, PA (US)

(72) Inventors: Brian J. Bollinger, Quakertown, PA (US); Venkatesh Chitta, Center Valley, PA (US); Firozbabu Cholashari, Macungie, PA (US); Jonathan Waldron, Bethlehem, PA (US)

(73) Assignee: Lutron Technology Company LLC, Coopersburg, PA (US)

( * ) Notice: Subject to any disclaimer, the term of this patent is extended or adjusted under 35 U.S.C. 154(b) by 128 days.

(21) Appl. No.: 16/875,921

(22) Filed: May 15, 2020

(65) Prior Publication Data

US 2020/0366188 A1 Nov. 19, 2020

Related U.S. Application Data

(60) Provisional application No. 62/849,494, filed on May 17, 2019.

(51) Int. Cl.
| | |
|---|---|
| *H02M 1/32* | (2007.01) |
| *H05B 45/37* | (2020.01) |
| *H05B 45/10* | (2020.01) |
| *H02M 1/08* | (2006.01) |

(Continued)

(52) U.S. Cl.
CPC .............. *H02M 1/32* (2013.01); *H02M 1/08* (2013.01); *H02M 7/219* (2013.01); *H05B 45/10* (2020.01); *H05B 45/37* (2020.01); *H05B 47/25* (2020.01)

(58) Field of Classification Search
CPC .......... H02M 1/32; H02M 1/08; H02M 7/219; H05B 45/10; H05B 45/37; H05B 39/048; H05B 41/3924; H05B 47/25; H05B 47/14; H03K 2217/0009; H03K 17/0822; H03K 17/102; H03K 17/122; H03K 17/166

See application file for complete search history.

(56) References Cited

U.S. PATENT DOCUMENTS

| | | | |
|---|---|---|---|
| 4,633,161 A | 12/1986 | Callahan et al. | |
| 5,239,255 A | * 8/1993 | Schanin | ............ H03K 17/0822 323/237 |
| 5,319,301 A | 6/1994 | Callahan et al. | |

(Continued)

*Primary Examiner* — Kyle J Moody  
*Assistant Examiner* — Jye-June Lee  
(74) *Attorney, Agent, or Firm* — Flaster Greenberg, P.C.

(57) ABSTRACT

A load control device for controlling power delivered from an AC power source to an electrical load may have a closed-loop gate drive circuit for controlling a semiconductor switch of a controllably conductive device. The controllably conductive device may be coupled in series between the source and the load. The gate drive circuit may generate a target signal in response to a control circuit. The gate drive circuit may shape the target signal over a period of time and may increase the target signal to a predetermined level after the period of time. The gate drive circuit may receive a feedback signal that indicates a magnitude of a load current conducted through the semiconductor switch. The gate drive circuit may generate a gate control signal in response to the target signal and the feedback signal, and render the semiconductor switch conductive and non-conductive in response to the gate control signal.

26 Claims, 11 Drawing Sheets

(51) Int. Cl.
*H02M 7/219* (2006.01)
*H05B 47/25* (2020.01)

(56) References Cited

U.S. PATENT DOCUMENTS

| | | | |
|---|---|---|---|
| 5,672,941 A | 9/1997 | Callahan et al. | |
| 6,347,028 B1 * | 2/2002 | Hausman, Jr. | H03K 17/0822 |
| | | | 361/93.1 |
| 6,969,959 B2 * | 11/2005 | Black | H03K 17/0822 |
| | | | 315/307 |
| 7,242,150 B2 | 7/2007 | DeJonge et al. | |
| 7,259,524 B2 | 8/2007 | Hausman et al. | |
| 7,546,473 B2 | 6/2009 | Newman | |
| 7,940,505 B1 * | 5/2011 | Sadate | H03K 17/0822 |
| | | | 361/93.8 |
| 8,664,881 B2 | 3/2014 | Newman, Jr. et al. | |
| 9,992,849 B1 * | 6/2018 | Slivka | H05B 47/25 |
| 2005/0185353 A1 * | 8/2005 | Rasmussen | H05B 39/044 |
| | | | 361/93.9 |
| 2017/0208659 A1 * | 7/2017 | Hau | H05B 45/10 |
| 2018/0359835 A1 * | 12/2018 | Moorthy | H02M 1/32 |
| 2019/0098716 A1 | 3/2019 | DeJonge et al. | |
| 2020/0366079 A1 * | 11/2020 | Telefus | H02M 1/08 |

* cited by examiner

LOAD CONTROL DEVICE HAVING A CLOSED-LOOP GATE DRIVE CIRCUIT INCLUDING OVERCURRENT PROTECTION

CROSS-REFERENCE TO RELATED APPLICATIONS

This application claims the benefit of Provisional U.S. Patent Application No. 62/849,494, filed May 17, 2019, the disclosure of which is incorporated herein by reference in its entirety.

BACKGROUND

Prior art load control devices, such as dimmer switches, may be coupled in series electrical connection between an alternating-current (AC) power source and a lighting load for controlling the amount of power delivered from the AC power source to the lighting load. A standard dimmer switch may typically comprise a bidirectional semiconductor switch, e.g., a thyristor (e.g., such as a triac) or two field-effect transistors (FETs) in anti-series connection. The bidirectional semiconductor switch may be coupled in series between the AC power source and the load and is controlled to be conductive and non-conductive for portions of a half cycle of the AC power source to thus control the amount of power delivered to the electrical load. Generally, dimmer switches may use either a forward phase-control dimming technique or a reverse phase-control dimming technique in order to control when the bidirectional semiconductor switch is rendered conductive and non-conductive to thus control the power delivered to the load.

There is a need for load control devices that meet the electromagnetic compatibility (EMC) performance requirements during turn-on and turn-off events across a variety of electrical loads. The inconsistency of EMC performance across a variety of electrical loads can cause some load control devices to create audible buzzing noises or damage their internal components during turn-on or turn-off events. Such EMC inconsistencies limit the compatible range of electrical loads for a load control device.

There is also a need for load control devices that are compatible with a broader range of internal components. For example, when an internal component, such as a semiconductor switch of an existing load control device has been changed or second sourced, the load control device may become inoperable or require a redesign due to the change is operating characteristics of the internal component. This is not only burdensome, but also costly.

Further, there are a need for overcurrent protection design in a load control device that allows for greater tolerance of natural overcurrent conditions but also prevents high current runaway. Existing overcurrent protection schemes in load control devices are rigid and do not allow for broad load compatibility. For example, some existing overcurrent protection schemes may trigger when a current limit is exceeded, regardless of any determined characteristics of the semiconductor switch or load.

SUMMARY

A load control device for controlling power delivered from an AC power source to an electrical load may have a closed-loop gate drive circuit for controlling a semiconductor switch (e.g., a field-effect transistor) of a controllably conductive device. The controllably conductive device may be adapted to be coupled in series between the AC power source and the electrical load, such that the semiconductor switch may conduct a load current through the electrical load.

A load control device may further comprise a control circuit that may generate a drive signal for controlling the gate drive circuit. The gate drive circuit may generate a target signal in response to the control circuit. For example, the gate drive circuit may generate a target signal in response the drive signal generated by the control circuit. The gate drive circuit may shape (e.g., wave-shape) the target signal over a period of time, for example, by adjusting a magnitude of the target signal with respect to time over the period of time. The gate drive circuit may receive a first feedback signal that may indicate a magnitude of the load current conducted through the semiconductor switch.

The gate drive circuit may generate a gate control signal in response to the target signal and the feedback signal. For example, the gate drive circuit may render the semiconductor switch of the controllably conductive device conductive and non-conductive in response to the gate control signal. The gate drive circuit may adjust a magnitude of the gate control signal in response to a magnitude of the feedback signal to adjust the magnitude of the load current towards a target current indicated by a magnitude of the target signal. For example, the gate drive circuit may monitor the load current through the electrical load and may adjust the magnitude of the gate control signal in response to the magnitude of the feedback signal and adjust the magnitude of the load current towards to the target current indicated by the magnitude of the target signal.

The gate drive circuit may further receive a second feedback signal that may indicate a magnitude of a voltage developed across the semiconductor switch. When rendering the semiconductor switch non-conductive, the gate drive circuit may shape (e.g., wave-shape) over a turn-off period. For example, the gate drive circuit may begin to shape the gate control signal (e.g., at the beginning of the turn-off period) in response to the second feedback signal (e.g., when the magnitude of the second feedback signal exceeds a threshold).

When rendering the semiconductor switch conductive, the gate drive circuit may shape the target signal over a turn-on period. In examples, the gate drive circuit may increase the target signal to a predetermined level after the turn-on period. When the magnitude of the target signal is at the predetermined level, the gate drive circuit may limit the magnitude of the load current to a maximum level (e.g., a maximum current level) set by the predetermined level. As described herein, the gate drive circuit may limit the magnitude of the load current to the maximum current level while the semiconductor switch is conductive. The gate drive circuit may detect an overcurrent condition when the magnitude of the gate drive signal is at the predetermined level (e.g., which indicates that the magnitude of the load current is at the maximum current level). The gate drive circuit may render the semiconductor switch non-conductive after a trip time period from when the overcurrent condition is detected. The trip time period may be based on a parameter of the semiconductor switch. The parameter of the semiconductor switch may include a temperature across the semiconductor switch, a power of the semiconductor switch, a voltage developed across the semiconductor switch, and/or the like. Alternatively, in some examples, the trip time period may be a fixed value.

DETAILED DESCRIPTION

Figure 1:
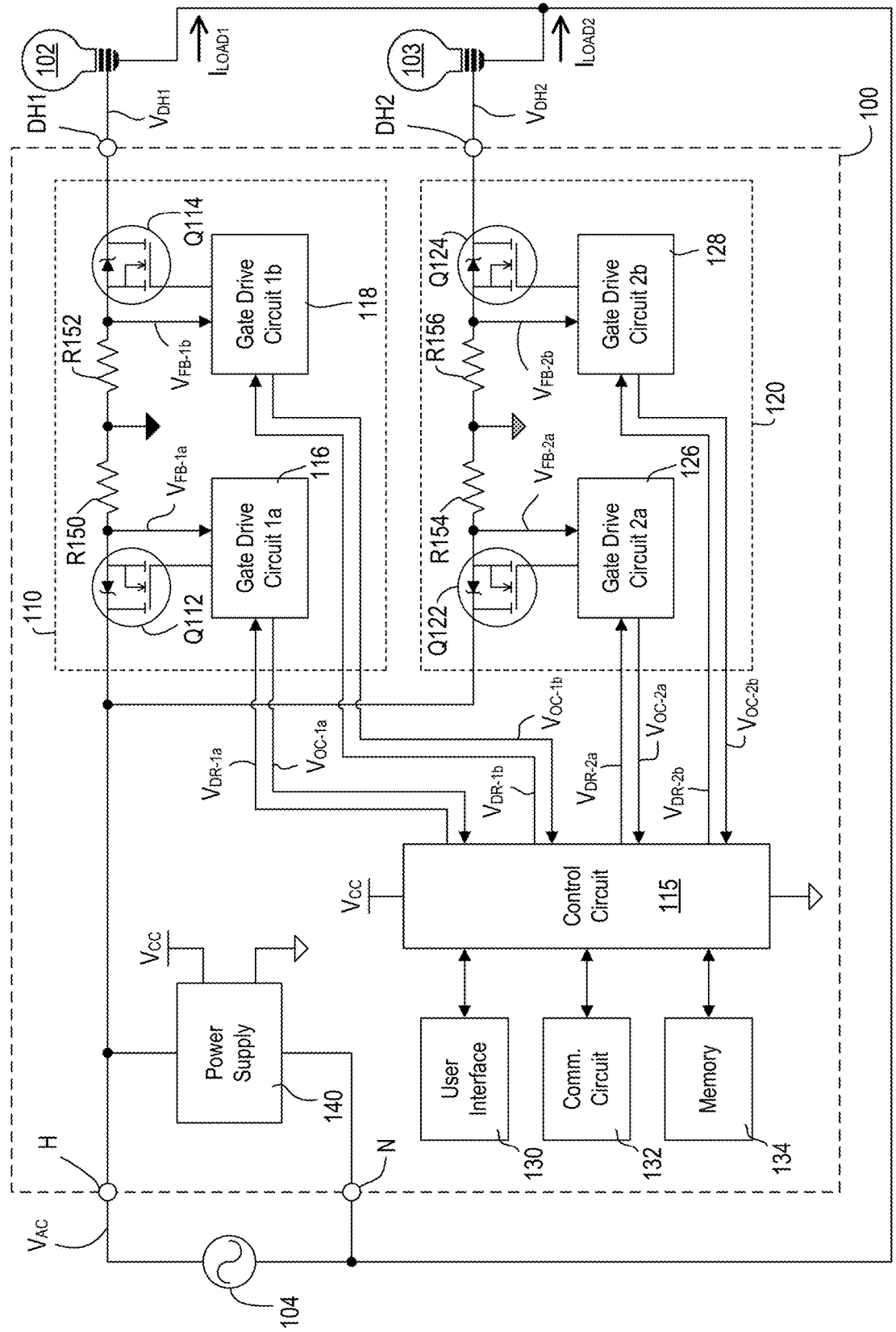
FIG. 1 is a block diagram of an example load control device for controlling the amount of power delivered to an electrical load.

FIG. 1 is a block diagram of an example load control device 100 (e.g., a dimmer switch) for controlling the amount of power delivered from an alternating-current (AC) power source to one or more electrical loads, such as lighting loads 102, 103. The load control device 100 may include a hot terminal H coupled to a hot side of the AC power source 104 for receiving an AC mains line voltage $V_{AC}$, a first dimmed-hot terminal DH1 coupled to the lighting load 102, and a second dimmed-hot terminal DH2 coupled to the lighting load 103. The load control device 100 may also include a neutral terminal N that may be adapted to be coupled to a neutral side of the AC power source 104.

The load control device 100 may comprise a first load control circuit 110 (e.g., a first dimming circuit) and a second load control circuit 120 (e.g., a second dimming circuit). The first load control circuit 110 may comprise a first controllably conductive device having semiconductor switches, such as two field-effect transistors (FETs) Q112, Q114. The FETs Q112, Q114 may be coupled in anti-series connection between the hot terminal H and the dimmed-hot terminal DH1. The junction of the FETs Q112, Q114 may be coupled to circuit common. The first load control circuit 110 may also include a first drive circuit 116 (e.g., a first closed-loop gate drive circuit) for controlling the first FET Q112 and a second drive circuit 118 (e.g., a second closed-loop gate drive circuit) for controlling the second FET Q114. In some alternate examples, the first controllably conductive device of the first load control circuit 110 may comprise a single FET in a full-wave bridge rectifier and the first load control circuit may comprise a single closed-loop gate drive circuit.

The load control device 100 may comprise a control circuit 115, e.g., a digital control circuit, for controlling the first load control circuit 110 to conduct a first load current $I_{LOAD1}$ through the first lighting load 102, and for controlling the second load control circuit 120 to conduct a second load current $I_{LOAD2}$ through the second lighting load 103. The control circuit 115 may include one or more of a processor (e.g., a microprocessor), a microcontroller, a programmable logic device (PLD), a field programmable gate array (FPGA), an application specific integrated circuit (ASIC), or any suitable controller or processing device. The load control device 100 may include a memory 134 configured to store operational characteristics of the load control device 100. The memory 134 may be implemented as an external integrated circuit (IC) or as an internal circuit of the control circuit 115. The load control device 100 may include a communication circuit 132 configured to transmit and receive messages (e.g., digital messages). The communication circuit 132 may be implemented as an external circuit or as an internal circuit of the control circuit 115.

The load control device 100 may include a user interface 130. The user interface 130 may include one or more actuators (e.g., buttons) for receiving user inputs and/or one or more visual indicators for providing user feedback. For example, the user interface 130 may include a toggle actuator and/or an intensity adjustment actuator (e.g., such as a slider control or a pair of raise and lower buttons) for controlling the lighting loads 102, 103. The control circuit 115 may be configured to control the load control circuits 110, 120 to control the amount of power delivered to the lighting load 102, 103 in response to actuations of the actuators of the user interface 130. In addition, the user interface 130 may also include one or more light-emitting diodes (LEDs) for illuminating the visual indicators, for example, to provide a visual indication of a status and/or a present intensity of a lighting load, and/or a visual indication of a selected preset. For example, the user interface 130 may comprise a vertically-oriented linear array of visual indicators. The control circuit 115 may be coupled to the LEDs for illuminating the visual indicators of the user interface 130 to provide feedback.

The control circuit 115 may generate one or more drive signals. For example, the control circuit 115 may generate first and second drive signals $V_{DR-1a}$, $V_{DR-1b}$, respectively, that may be received by the first and second gate drive circuits 116, 118, respectively, for controlling the FETs Q112, Q114. The drive signals $V_{DR-1a}$, $V_{DR-1b}$ may be provided to the first and second gate drive circuits 116, 118 of the first load control circuit 110 for adjusting the magnitude of a first dimmed-hot voltage $V_{DH1}$ (e.g., a first load voltage) generated across the lighting load 102 and/or the magnitude of the first load current $I_{LOAD1}$ conducted through the lighting load 102, for example, to control the intensity of the lighting load 102 to a target intensity $L_{TRGT1}$, which may range between a high-end intensity $L_{HE}$ (e.g., 100%) and a low-end intensity $L_{LE}$ (e.g., 0.1-5%). The control circuit 115 may adjust a duty cycle (e.g., an on time) of the drive signals $V_{DR-1a}$, $V_{DR-1b}$ to adjust the intensity of the lighting load 102.

The control circuit 115 may generate the drive signals $V_{DR-1a}$, $V_{DR-1b}$ to render the first FET Q112 to be non-conductive to prevent the first load current $I_{LOAD1}$ from flowing through the lighting load 102 during the positive half cycles, and the second FET Q114 to be non-conductive to prevent the first load current $I_{LOAD1}$ from flowing through the lighting load 102 during the negative half cycles. When the first controllably conductive device (e.g., the first FET Q112) is rendered conductive during the positive half cycles of the AC power source 104, the first load current $I_{LOAD1}$ may be conducted through the drain-source channel of the first FET Q112 and the body diode of the second FET Q114. When the first controllably conductive device (e.g., the second FET Q114) is rendered conductive during the negative half cycles of the AC power source 104, the load current $I_{LOAD}$ may be conducted through the drain-source channel of the second FET Q114 and the body diode of the first FET Q112.

The first and the second gate drive circuits 116, 118 may receive the drive signals $V_{DR-1a}$, $V_{DR-1b}$ from the control circuit 115 and use the drive signals $V_{DR-1a}$, $V_{DR-1b}$ to control the magnitude of the first load current $I_{LOAD1}$ conducted through the lighting load 102. For example, the first and second gate drive circuits 116, 118 may generate respective gate control signals in response to the drive signals $V_{DR-1a}$, $V_{DR-1b}$, and provide the respective gate control signals to the gates of the first and second FETs Q112, Q114 to render the FETs Q112, Q114 conductive and non-conductive and control the intensity of the lighting load 102. The gate drive circuits 116, 118 may include a wave-shaping circuit, a target voltage set circuit, an overcurrent protection circuit, an overcurrent detection circuit, and/or the like (e.g., as described herein).

The first load control circuit 110 may include first and second feedback circuits, such as a first sense resistor R150 and a second sense resistor R152, respectively, that generate first and second feedback signals $V_{FB-1a}$, $V_{FB-1b}$ indicative of a magnitude of the first load current $I_{LOAD1}$ conducted through the FETs Q112, Q114. For example, the first sense resistor R150 may generate a first feedback signal $V_{FB-1a}$ that is indicative of a magnitude of the first load current $I_{LOAD1}$ conducted through the FET Q112 during the positive half cycles, while the second sense resistor R152 may generate a second feedback signal indicative $V_{FB-1b}$ that is indicative of a magnitude of the first load current $I_{LOAD1}$ conducted through the FET Q114 during the negative half cycles.

The first gate drive circuit 116 may receive the first feedback signal $V_{FB-1a}$ and may generate the first gate control signal for controlling the first FET Q112 in response to the first drive signal $V_{DR-1a}$ and the first feedback signal $V_{FB-1a}$. For example, the first gate drive circuit 116 may be configured to adjust a magnitude of the first gate control signal in response to a magnitude of the first feedback signal $V_{FB-1a}$ to adjust the magnitude of the first load current $I_{LOAD1}$ towards a target current indicated by a magnitude of a target signal. Further, in some examples, the first gate drive circuit 116 may generate a shaped (e.g. wave-shaped) target signal based on the drive signal $V_{DR-1a}$, and the first gate drive circuit 116 may generate the first gate control signal for the first FET Q112 in response to the shaped target signal and the first feedback signal $V_{FB-1a}$ (e.g., as described herein). For example, the control circuit 115 may be configured to generate the first drive signal $V_{DR-1a}$, and the first gate drive circuit 116 may be configured to shape (e.g., start shaping) the target signal in response to the first drive signal $V_{DR-1a}$.

Similarly, the second gate drive circuit 118 may receive the second feedback signal $V_{FB-1b}$ and may generate the second gate control signal for controlling the second FET Q114 in response to the second drive signal $V_{DR-1b}$ and the second feedback signal $V_{FB-1b}$. For example, the second gate drive circuit 118 may be configured to adjust a magnitude of the second gate control signal in response to a magnitude of the second feedback signal $V_{FB-1b}$ to adjust the magnitude of the first load current $I_{LOAD1}$ towards a target current indicated by a magnitude of a target signal. Further, in some examples, the second gate drive circuit 118 may generate a shaped target signal based on the second drive signal $V_{DR-1b}$, and the second gate drive circuit 118 may generate the gate control signal for the second FET Q114 in response to the shaped target signal and the second feedback signal $V_{FB-1b}$ (e.g., as described herein). For example, the control circuit 115 may be configured to generate the second drive signal $V_{DR-1b}$, and the second gate drive circuit 118 may be configured to shape (e.g., start shaping) the target signal in response to the second drive signal $V_{DR-1b}$.

The gate drive circuits 116, 118 may generate respective overcurrent detection signals $V_{OC-1a}$, $V_{OC-1b}$, which may be received by the control circuit 115. The gate drive circuits 116, 118 may be configured to detect an overcurrent condition in the respective FETs Q112, Q114 and generate the overcurrent detection signals $V_{OC-1a}$, $V_{OC-1b}$ to indicate the overcurrent condition. The control circuit 115 may control the user interface 130 to provide feedback to a user to indicate the overcurrent condition (e.g., by illuminating one or more visual indicators).

The first load control circuit 110 (e.g., the first and second gate drive circuits 116, 118) may be configured to provide overcurrent protection for the load control device 100. In some examples, the first and second gate drive circuits 116, 118 may be configured to detect an overcurrent condition in the respective FET Q112, Q114 in response to the respective gate control signal. Further, in some examples, the first gate drive circuit 116 may be configured to limit the magnitude of the first load current $I_{LOAD1}$ to a maximum current level when the FET Q112 is conductive during the positive half cycles, detect an overcurrent condition when the magnitude of the first load current $I_{LOAD1}$ is at the maximum current level, and render the FET Q112 non-conductive after a trip time period from when the overcurrent condition is detected. Similarly, the second gate drive circuit 118 may be configured to limit the magnitude of the first load current $I_{LOAD1}$ to a maximum current level when the FET Q114 is conductive during the negative half cycles, detect an overcurrent condition when the magnitude of the first load current $I_{LOAD1}$ is at the maximum current level, and render the FET Q114 non-conductive after a trip time period from when the overcurrent condition is detected. The length of the trip time period may be based on a parameter of the FET Q112, Q114, such as temperature of the semiconductor switch, a measured power of the semiconductor switch, or a drain source voltage of developed across the semiconductor switch. The length of the trip time period may be fixed. Further, in some examples, the gate drive circuits 116, 118 may be configured to render the FET Q112, Q114 non-conductive by driving the magnitude of the respective gate control signals to zero volts.

The control circuit 115 may also be configured to provide overcurrent protection (e.g., redundant overcurrent protection) for the load control device 100 in response to the overcurrent detection signals $V_{OC-1a}$, $V_{OC-1b}$ generated by the gate drive circuits 116, 118. For example, the control circuit 115 may be configured to control the drive signals $V_{DR-1a}$, $V_{DR-1b}$ to render the FETs Q112, Q114 non-conductive when the either of the overcurrent detection signals $V_{OC-1a}$, $V_{OC-1b}$ indicates an overcurrent condition. If the overcurrent condition persists repeatedly (e.g., for a number of half cycles, such as 10 half cycles in a row), the control circuit 115 may render the FETs Q112, Q114 to turn off the lighting load 102 for a period of time (e.g., a few seconds), and then attempt to turn the lighting load 102 back on.

The second load control circuit 120 may operate similar to the first load control circuit 110 as described herein. The second load control circuit 120 may comprise a second controllably conductive device having semiconductor switches, such as two field-effect transistors (FETs) Q122, Q124. The FET Q122, Q124 may be coupled in anti-series connection between the hot terminal Hand the dimmed-hot terminal DH2. The junction of the FETs Q122, Q124 may be coupled to circuit common. The second load control circuit 120 may also include a first gate drive circuit 126 (e.g., a first closed-loop gate drive circuit) for controlling a first FET Q122, and a second gate drive circuit 128 (e.g., a second closed-loop gate drive circuit) for controlling a second FET Q124. In some alternate examples, the second controllably conductive device of the second load control circuit 120 may comprise a single FET in a full-wave bridge rectifier and the second load control circuit 120 may comprise a single closed-loop gate drive circuit.

The control circuit 115 may control the second load control circuit 120 to conduct the second load current $I_{LOAD2}$ through the second lighting load 103. For example, the control circuit 115 may generate first and second drive signals $V_{DR-2a}$, $V_{DR-2b}$, respectively, that may be received by the first and second gate drive circuits 126, 128, respectively, for controlling the FETs Q122, Q124. The drive signals $V_{DR-2a}$, $V_{DR-2b}$ may be provided to the first and second gate drive circuits 126, 128 of the second load control circuit 120 for adjusting the magnitude of a second dimmed-hot voltage $V_{DH2}$ (e.g., a first load voltage) generated across the lighting load 103 and/or the magnitude of the second load current $I_{LOAD2}$ conducted through the lighting load 103, for example, to control the intensity of the lighting load 103 to a target intensity $L_{TRGT2}$, which may range between a high-end intensity $L_{HE}$ (e.g., 100%) and a low-end intensity $L_{LE}$ (e.g., 0.1-5%). The control circuit 115 may adjust a duty cycle (e.g., an on time) of the drive signals $V_{DR-2a}$, $V_{DR-2b}$ to adjust the intensity of the lighting load 103.

The control circuit 115 may generate the drive signals $V_{DR-2a}$, $V_{DR-2b}$ to render the first FET Q122 to be non-conductive to prevent the second load current $I_{LOAD2}$ from flowing through the lighting load 103 during the positive half cycles, and the second FET Q124 to be non-conductive to prevent the second load current $I_{LOAD2}$ from flowing through the lighting load 103 during the negative half cycles. When the second controllably conductive device (e.g., the first FET Q122) is rendered conductive during the positive half cycles of the AC power source 104, the second load current $I_{LOAD2}$ may be conducted through the drain-source channel of the first FET Q122 and the body diode of the second FET Q124. When the second controllably conductive device (e.g., the second FET Q124) is rendered conductive during the negative half cycles of the AC power source 104, the second load current $I_{LOADs}$ may be conducted through the drain-source channel of the second FET Q124 and the body diode of the first FET Q122.

The first and the second gate drive circuits 126, 128 may receive the drive signals $V_{DR-2a}$, $V_{DR-2b}$ from the control circuit 115 and use the drive signals $V_{DR-2a}$, $V_{DR-2b}$ to control the magnitude of the second load current $I_{LOAD2}$ conducted through lighting load 103. For example, the first and second gate drive circuits 126, 128 may generate respective gate control signals in response to the drive signals $V_{DR-2a}$, $V_{DR-2b}$, and provide the respective gate control signals to the gates of the first and second FETs Q122, Q124 to render the FETs Q122, Q124 conductive and non-conductive and control the intensity of the lighting load 103. The gate drive circuits 126, 128 may include a wave-shaping circuit, a target voltage set circuit, an overcurrent protection circuit, an overcurrent detection circuit, and/or the like (e.g., as described herein).

The second load control circuit 120 may include first and second feedback circuits, such as a first sense resistor R154 and a second sense resistor R156, respectively, that generate first and second feedback signals $V_{FB-2a}$, $V_{FB-2b}$ indicative of a magnitude of the second load current $I_{LOAD2}$ conducted through the FETs Q122, Q124. For example, the first sense resistor R154 may generate a first feedback signal $V_{FB-2a}$ that is indicative of a magnitude of the second load current $I_{LOAD2}$ conducted through the FET Q122 during the positive half cycles, while the second sense resistor R156 may generate a second feedback signal indicative $V_{FB-2b}$ that is indicative of a magnitude of the second load current $I_{LOAD2}$ conducted through the FET Q124 during the negative half cycles.

The first gate drive circuit 126 may receive the first feedback signal $V_{FB-2a}$ and may generate a gate control signal for controlling the first FET Q122 in response to the first drive signal $V_{DR-2a}$ and the first feedback signal $V_{FB-2a}$. For example, the first gate drive circuit 126 may be configured to adjust a magnitude of the first gate control signal in response to a magnitude of the first feedback signal $V_{FB-2a}$ to adjust the magnitude of the second load current $I_{LOAD2}$ towards a target current indicated by a magnitude of a target signal. Further, in some examples, the first gate drive circuit 126 may generate a shaped target signal based on the drive signal $V_{DR-2a}$, and the first gate drive circuit 126 may generate the first gate control signal for the first FET Q122 in response to the shaped target signal and the first feedback signal $V_{FB-2a}$ (e.g., as described herein). For example, the control circuit 115 may be configured to generate the first drive signal $V_{DR-2a}$, and the first gate drive circuit 126 may be configured to shape (e.g., start shaping) the target signal in response to the first drive signal $V_{DR-2a}$.

Similarly, the second gate drive circuit 128 may receive the second feedback signal $V_{FB-2b}$ and may generate the second gate control signal for controlling the second FET Q124 in response to the second drive signal $V_{DR-2b}$ and the second feedback signal $V_{FB-2b}$. For example, the second gate drive circuit 128 may be configured to adjust a magnitude of the second gate control signal in response to a magnitude of the second feedback signal $V_{FB-2b}$ to adjust the magnitude of the second load current $I_{LOAD2}$ towards a target current indicated by a magnitude of a target signal. Further, in some examples, the second gate drive circuit 128 may generate a shaped target signal based on the second drive signal $V_{DR-2b}$, and the second gate drive circuit 128 may generate the gate control signal for the second FET Q124 in response to the shaped target signal and the second feedback signal $V_{FB-2b}$ (e.g., as described herein). For example, the control circuit 115 may be configured to generate the second drive signal $V_{DR-2b}$, and the second gate drive circuit 128 may be configured to shape (e.g., start shaping) the target signal in response to the second drive signal $V_{DR-2b}$.

The gate drive circuits 126, 128 may generate respective overcurrent signals $V_{OC-2a}$, $V_{OC-2b}$, which may be received by the control circuit 115. The gate drive circuits 126, 128 may be configured to detect an overcurrent condition in the respective FETs Q122, Q124 and generate the overcurrent detection signals $V_{OC-2a}$, $V_{OC-2b}$ to indicate the overcurrent condition. The control circuit 115 may control the user interface 130 to provide feedback to a user to indicate the overcurrent condition (e.g., by illuminating one or more visual indicators).

The second load control circuit 120 (e.g., the first and second gate drive circuits 126, 128) may be configured to provide overcurrent protection for the load control device 100. In some examples, the first and second gate drive circuits 126, 128 may be configured to detect an overcurrent condition in the semiconductor switch Q122, Q124 in response to their respective gate control signals. Further, in some examples, the first gate drive circuit 126 may be configured to limit the magnitude of the second load current $I_{LOAD2}$ to a maximum current level when the semiconductor switch Q122 is conductive during the positive half cycles, detect an overcurrent condition when the magnitude of the second load current $I_{LOAD2}$ is at the maximum current level, and render the semiconductor switch Q122 non-conductive after a trip time period from when the overcurrent condition is detected. Similarly, the second gate drive circuit 128 may be configured to limit the magnitude of the second load current $I_{LOAD2}$ to a maximum current level when the semiconductor switch Q124 is conductive during the negative half cycles, detect an overcurrent condition when the magnitude of the second load current $I_{LOAD2}$ is at the maximum current level, and render the semiconductor switch Q124 non-conductive after a trip time period from when the overcurrent condition is detected. The length of the trip time period may be based on a parameter of the semiconductor switch Q122, Q124, such as temperature of the semiconductor switch, a measured power of the semiconductor switch, or a drain source voltage of developed across the semiconductor switch. Further, in some examples, the gate drive circuits 126, 128 may be configured to render the semiconductor switches Q122, Q124 non-conductive by driving the magnitude of the respective gate control signals to zero volts.

The control circuit 115 may also be configured to provide overcurrent protection (e.g., redundant overcurrent protection) for the load control device 100 in response to the overcurrent detection signals $V_{OC\text{-}2a}$, $V_{OC\text{-}2b}$ generated by the gate drive circuits 126, 128. For example, the control circuit 115 may be configured to control the drive signals $V_{DR\text{-}2a}$, $V_{DR\text{-}2b}$ to render the FETs Q122, Q124 non-conductive when the either of the overcurrent detection signals $V_{OC\text{-}2a}$, $V_{OC\text{-}2b}$ indicates an overcurrent condition. If the overcurrent condition persists repeatedly (e.g., for a number of half cycles, such as 10 half cycles in a row), the control circuit 115 may render the FETs Q122, Q124 to turn off the lighting load 103 for a period of time (e.g., a few seconds), and then attempt to turn the lighting load 103 back on.

The load control device 100 may include a power supply 140. The power supply 140 may receive the AC mains line voltage $V_{AC}$ and may generate a direct-current (DC) supply voltage $V_{CC}$ (e.g., approximately 3.3V). For example, the power supply 140 may power the control circuit 115 and/or other low-voltage circuits of the load control device 100. Each of the first and second load control circuits 110, 120 may comprise a respective power supply (not shown) configured to generate respective supply voltages (e.g., approximately 15V) for driving the respective semiconductor switches Q112, Q114, Q122, Q124 (e.g., as will be described in greater detail below with reference to FIG. 3).

The control circuit 115 may be configured to determine times of zero-crossing points of the AC mains line voltage $V_{AC}$ of the AC power source 104. For example, the load control device 100 may comprise a zero-crossing detect circuit (not shown) that may be coupled to the hot terminal H and the neutral terminal N, and generates a zero-cross signal that indicates the zero-crossing points of the AC mains line voltage $V_{AC}$. The control circuit 115 may then render the semiconductor switches Q112, Q114, Q122, Q124 conductive and/or non-conductive at predetermined times (e.g., at a firing time or firing angle) relative to the zero-crossing points of the AC mains line voltage $V_{AC}$ (e.g., as determined from the zero-cross signal) to generate a phase-control dimmed-hot voltage $V_{PC}$ using a phase-control dimming technique (e.g., a forward phase-control dimming technique and/or a reverse phase-control dimming technique). For example, the control circuit 115 may use the forward phase-control dimming technique to control inductive loads and may use the reverse phase-control dimming technique to control capacitive loads. Examples of dimmers are described in greater detail in commonly-assigned U.S. Pat. No. 7,242,150, issued Jul. 10, 2007, entitled DIMMER HAVING A POWER SUPPLY MONITORING CIRCUIT; U.S. Pat. No. 7,546,473, issued Jun. 9, 2009, entitled DIMMER HAVING A MICROPROCESSOR-CONTROLLED POWER SUPPLY; and U.S. Pat. No. 8,664,881, issued Mar. 4, 2014, entitled TWO-WIRE DIMMER SWITCH FOR LOW-POWER LOADS, the entire disclosures of which are incorporated by reference herein.

The control circuit 115 may be configured to adjust a firing time (e.g., a phase angle) of the controllably conductive devices of the load control circuits 110, 120 each half cycle to control the amount of power delivered to the lighting load 102, 103 and to control the intensity of the lighting loads 102, 103 toward respective target intensities. The control circuit 115 may be configured to control the semiconductor switches Q112, Q114, Q122, Q124 using the forward phase-control dimming technique and/or the reverse phase-control dimming technique. When using the forward phase-control dimming technique, the control circuit 115 may render one or more of the semiconductor switches Q112, Q114, Q122, Q124 non-conductive (e.g., to cause the controllably conductive devices 110, 120 to be non-conductive) at the beginning of each half cycle of the AC mains line voltage, and then render one or more of the semiconductor switches Q112, Q114, Q122, Q124 conductive (e.g., to cause the controllably conductive devices 110, 120 to be conductive) at a firing time during the half cycle after which the controllably conductive devices 110, 120 may remain conductive until the end of the half cycle. When using the reverse phase-control dimming technique, the control circuit 115 may render one or more of the semiconductor switches Q112, Q114, Q122, Q124 conductive (e.g., to cause the controllably conductive devices 110, 120 to be conductive) at the beginning of each half cycle of the AC mains line voltage, and then render one or more of the semiconductor switches Q112, Q114, Q122, Q124 non-conductive (e.g., to cause the controllably conductive devices 110, 120 to be non-conductive) at a firing time during the half cycle after which the controllably conductive devices 110, 120 may remain non-conductive until the end of the half cycle.

Figure 2:
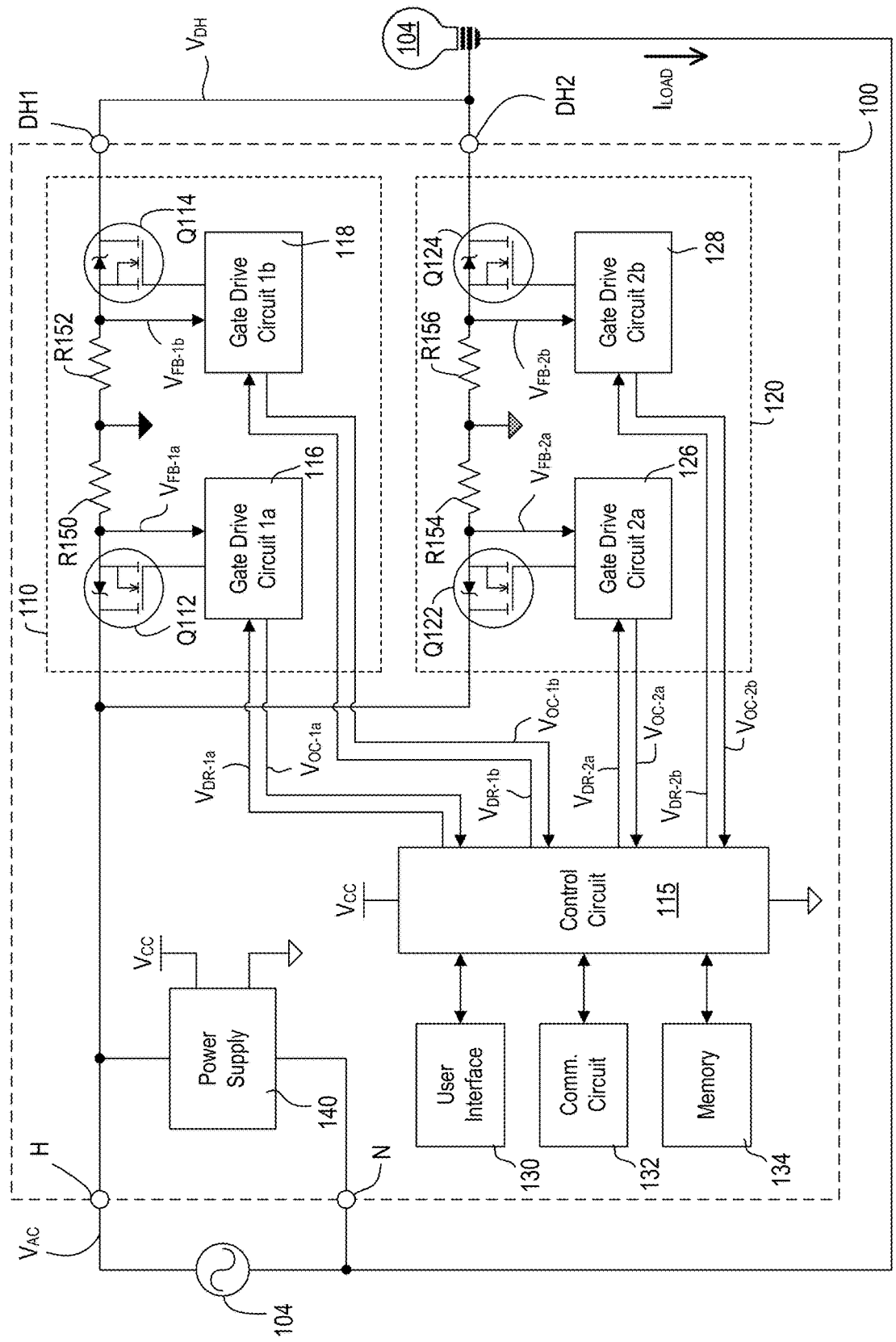
FIG. 2 is a block diagram of the load control device of FIG. 1 in an alternate configuration for controlling the amount of power delivered to an electrical load via a parallel output configuration.

FIG. 2 is a block diagram of the load control device 100 in an alternate configuration. The first and second dimmed-hot terminals DH1, DH2 may be coupled together to a single lighting load 104. For example, the lighting load 104 may having a high power rating than the lighting loads 102, 104 of FIG. 1, and may conduct a load current $I_{LOAD}$ having a higher magnitude through the load control device 100. Because the first and second dimmed-hot terminals DH1, DH2 are coupled together, the first controllably conductive device of the first load control circuit 110 and the second controllably conductive device of the second load control circuit 120 may be electrically coupled in parallel with each other, and may each conduct at least a portion of the load current $I_{LOAD}$ through the lighting load 104. The control circuit 115 may control the first controllably conductive device 110 and the second controllably conductive device 120 together to control the lighting load 104. For example, the control circuit 115 may generate the first drive signals $V_{DR-1a}$, $V_{DR-2a}$, such that the first drive signals $V_{DR-1a}$, $V_{DR-2a}$ are the same, for example, having the same duty cycles and in phase with each other (e.g., synchronized to the AC mains line voltage $V_{AC}$). In addition, the control circuit 115 may generate the second drive signals $V_{DR-1b}$, $V_{DR-2b}$, such that the second drive signals $V_{DR-1b}$, $V_{DR-2b}$ are also the same, for example, having the same duty cycles and in phase with each other (e.g., synchronized to the AC mains line voltage $V_{AC}$). Because the first and second controllably conductive devices are coupled in parallel with each other and share the load current $I_{LOAD}$, the load control device may be able to control lighting loads having a higher power rating than when the lighting loads are coupled individually coupled to the load control circuits 110, 120 as shown in FIG. 1.

Figure 3:
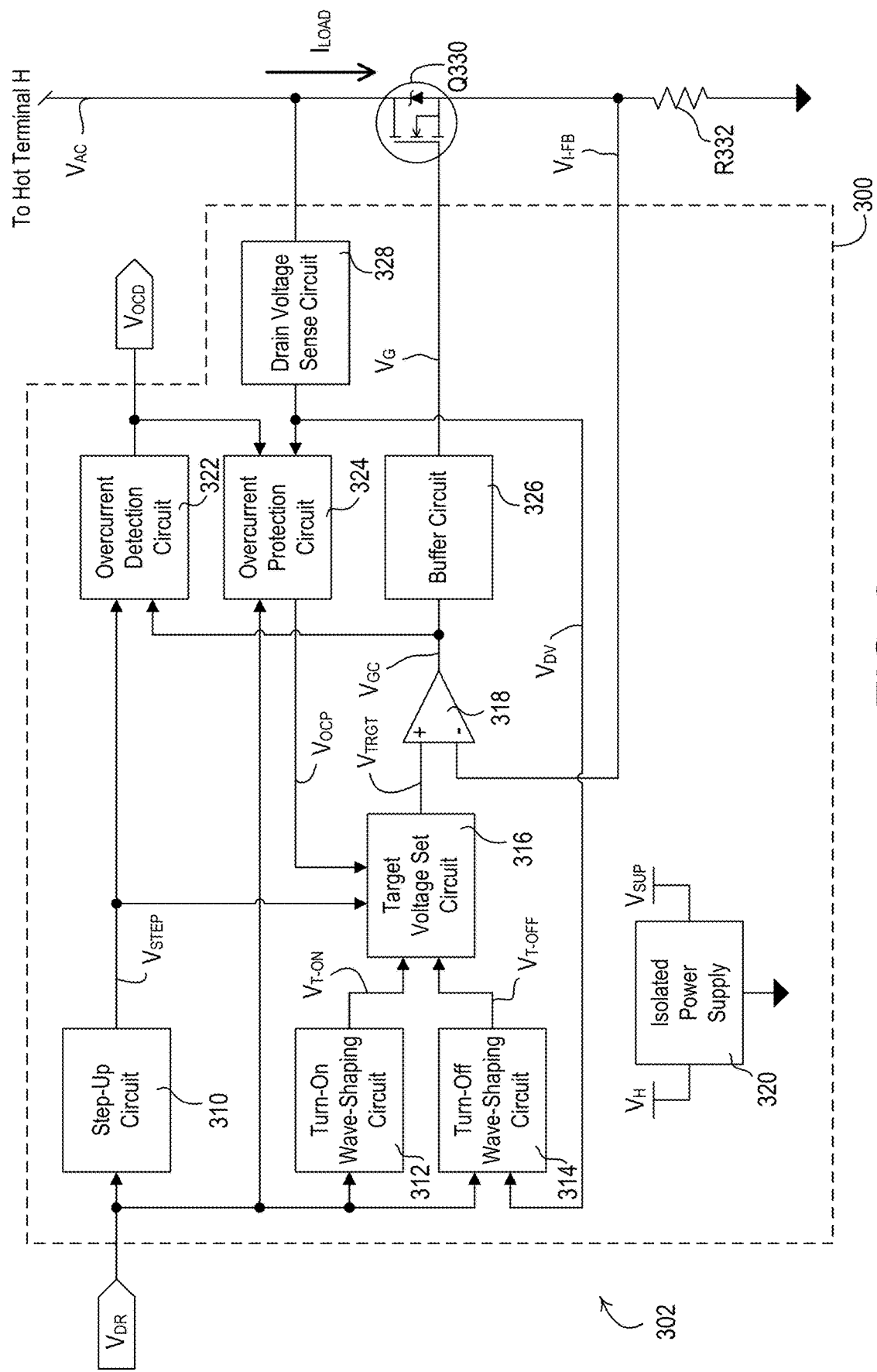
FIG. 3 is a block diagram of an example gate drive circuit configured to control the amount of power delivered to an electrical load.

FIG. 3 is a block diagram of an example gate drive circuit 300 of a load control circuit 302 of a load control device, such as the gate drive circuits 116, 118, 126, 128 shown in FIGS. 1 and 2. As described herein, the gate drive circuit 300 may monitor a load current $I_{LOAD}$ conducted through an electrical load, such as a lighting load (e.g., lighting loads 102, 103, 104 shown in FIGS. 1 and 2), and may generate a signal (e.g., a gate control signal $V_{GC}$) to control a semiconductor switch, such as a FET Q330 (e.g., FETs Q112, Q114, Q122, Q124 shown in FIGS. 1 and 2), to control the amount of power delivered to an electrical load.

The gate drive circuit 300 may receive a signal, such as a drive signal $V_{DR}$ from a control circuit (e.g., such as the drive signals $V_{DR-1a}$, $V_{DR-1b}$, $V_{DR-2a}$, $V_{DR-2b}$ generated by the control circuit 115 shown in FIG. 1 or the control circuit 215 shown in FIG. 2). The gate drive circuit 300 may be configured to render the FET Q330 conductive and non-conductive in response to the drive signal $V_{DR}$. The gate drive circuit 300 may generate a target signal $V_{TRGT}$ in response to the drive signal $V_{DR}$ received from the control circuit. The target signal $V_{TRGT}$ may be shaped, e.g., having a magnitude that adjusts with respect to time over a period of time. The period of time may be a preconfigured period of time and may allow the gate drive circuit 300 to have smooth turn-on and/or turn-off transitions. The gate drive circuit 300 may generate the target signal $V_{TRGT}$ (e.g., using a turn-on signal $V_{T-ON}$, a turn-off signal $V_{T-OFF}$, etc.) by adjusting a magnitude of the target signal $V_{TRGT}$ over the period of time, for example, as described herein.

The gate drive circuit 300 may receive a feedback signal $V_{I-FB}$ that may have a magnitude that indicates a magnitude of the load current $I_{LOAD}$ conducted through the FET Q330 (e.g., and conducted through the electrical load). For example, the load control circuit 302 may include a feedback circuit, such as a sense resistor R332, that generates the feedback signal $V_{I-FB}$. The sense resistor R332 may be coupled between the FET Q330 and circuit common, and may conduct the load current $I_{LOAD}$. The feedback signal $V_{I-FB}$ may be generate across the sense resistor R332 and may be referenced to as circuit common of the gate drive circuit 300. The magnitude of the feedback signal $V_{I-FB}$ (e.g., the voltage generated across the sense resistor R332) may be proportional to the magnitude of the load current $I_{LOAD}$ conducted through the FET Q330 (e.g., dependent upon a resistance of the sense resistor R332). The gate drive circuit 300 may generate the gate control signal $V_{GC}$ in response to the target signal $V_{TRGT}$ and the feedback signal $V_{I-FB}$. When the FET Q330 is conductive, the gate drive circuit 300 may control the FET Q330 in the linear region to adjust an impedance (e.g., a drain-source impedance) of the FET Q330 based on the gate control signal $V_{GC}$. The gate drive circuit 300 may control the FET Q330 to adjust the impedance of the FET Q330 in response to the feedback signal $V_{I-FB}$ to control the magnitude of the load current $I_{LOAD}$ towards the target signal $V_{TRGT}$.

The gate drive circuit 300 may comprise a step-up circuit 310, a turn-on wave-shaping circuit 312, and a turn-off wave-shaping circuit 314. The step-up circuit 310, the turn-on wave-shaping circuit 312, and/or the turn-off wave-shaping circuit 314 may receive the drive signal $V_{DR}$ from the control circuit. In addition, the drive signal $V_{DR}$ may be coupled to the step-up circuit 310, the turn-on wave-shaping circuit 312, and/or the turn-off wave-shaping circuit 314 via an optocoupler (not shown), such that the control circuit is electrically isolated from the gate drive circuit 300.

The turn-on wave-shaping circuit 312 may receive the drive signal $V_{DR}$ from the control circuit and may generate a turn-on signal $V_{T-ON}$. For example, the turn-on wave-shaping circuit 312 may shape (e.g., wave-shape) the turn-on signal $V_{T-ON}$ during a turn-on period $T_{T-ON}$ (e.g., approximately 50 µsec). The turn-on wave-shaping circuit 312 may shape (e.g., begin shaping) the turn-on signal $V_{T-ON}$ at a time during the turn-on period $T_{T-ON}$ (e.g., at the beginning time of the turn-on period $T_{T-ON}$). The turn-on wave-shaping circuit 312 may provide the turn-on signal $V_{T-ON}$ to a target voltage set circuit 316, which may use the turn-on signal $V_{T-ON}$ to generate the target signal $V_{TRGT}$. The turn-on wave-shaping circuit 312 may shape the turn-on signal $V_{T-ON}$ with a preconfigured shape, such as an S-shape. For example, the turn-on wave-shaping circuit 312 may wave-shape the turn-on signal $V_{T-ON}$ with a first shape during a first portion of the turn-on period $T_{T-ON}$ and wave-shape the turn-on signal $V_{T-ON}$ with a second shape during a second portion of the turn-on period $T_{T-ON}$ so that the target signal $V_{TRGT}$ has a preconfigured shape, such as an S-shape. Although illustrated as an S-shape, the turn-on wave-shaping circuit 312 may shape the turn-on signal $V_{T-ON}$ with any shape (e.g., such as a ramp). The turn-on wave-shaping circuit 312 may control the magnitude of the turn-on signal $V_{T-ON}$ to a rated current magnitude $V_{I-RTD}$ (e.g., a rated current value) at the end of the turn-on period $T_{T-ON}$. For example, the rated current magnitude $V_{I-RTD}$ may be approximately 7.5 volts.

The step-up circuit 310 may receive the drive signal $V_{DR}$ from the control circuit and provide a step signal $V_{STEP}$ to the target voltage set circuit 316, which may use the step signal $V_{STEP}$ to generate the target signal $V_{TRGT}$. For example, the step signal $V_{STEP}$ may be similar to the drive signal $V_{DR}$ received from the control circuit. The step-up circuit 310 may drive the magnitude of the step signal $V_{STEP}$ high (e.g., towards the isolated supply voltage $V_{SUP}$) after a delay period $T_{DELAY}$ after the drive signal $V_{DR}$ is driven high (e.g., towards the DC supply voltage $V_{CC}$).

The gate drive circuit 300 may also include a drain voltage sense circuit 328 that is coupled to the FET Q330 (e.g., to the drain of the FET Q330). The drain voltage sense circuit 328 may detect a magnitude of a voltage developed across the FET Q330. The drain voltage sense circuit 328 may provide a second feedback signal (e.g., a drain voltage sense signal $V_{DV}$) to the turn-off wave-shaping circuit 314. The drain voltage signal $V_{DV}$ may indicate the magnitude of the voltage across the FET Q330.

The turn-off wave-shaping circuit 314 may receive the drive signal $V_{DR}$ from the control circuit and the drain voltage signal $V_{DV}$ from the drain voltage sense circuit 328. The turn-off wave-shaping circuit 314 may generate a turn-off signal $V_{T\text{-}OFF}$ in response to the drive signal $V_{DR}$ and the drain voltage signal $V_{DV}$. For example, the turn-off wave-shaping circuit 314 may shape the turn-off signal $V_{T\text{-}OFF}$ over a period of time, such as during a turn-off period $T_{T\text{-}OFF}$, to generate the turn-off signal $V_{T\text{-}OFF}$. The turn-off wave-shaping circuit 314 may shape the turn-off signal $V_{T\text{-}OFF}$ in response to receiving the drain voltage signal $V_{DV}$ from the drain voltage sense circuit 328. For example, upon receiving the drain voltage signal $V_{DV}$, the turn-off wave-shaping circuit 314 may shape (e.g., begin to shape) the turn-off signal $V_{T\text{-}OFF}$. The turn-off wave-shaping circuit 314 may provide the turn-off signal $V_{T\text{-}OFF}$ to a target voltage set circuit 316, which may use the turn-off signal $V_{T\text{-}OFF}$ to generate the target signal $V_{TRGT}$. The turn-off wave-shaping circuit 314 may shape the turn-off signal $V_{T\text{-}OFF}$ with a preconfigured shape, such as a S-shape, so that the turn-off signal $V_{T\text{-}OFF}$ also has the preconfigured shape. For example, the turn-off wave-shaping circuit 314 may shape the turn-off signal $V_{T\text{-}OFF}$ with a first shape during a first portion of the turn-off period $T_{T\text{-}OFF}$, and may shape the turn-off signal $V_{T\text{-}OFF}$ with a second shape during a second portion of the turn-off period $T_{T\text{-}OFF}$ so that the target signal $V_{TRGT}$ has a preconfigured shape, such as an S-shape. Although illustrated as an S-shape, the turn-off wave-shaping circuit 315 may shape the turn-off signal $V_{T\text{-}OFF}$ with any shape (e.g., such as a ramp).

The target voltage set circuit 316 may receive the turn-on signal $V_{T\text{-}ON}$ from the turn-on wave-shaping circuit 312, the turn-off signal $V_{T\text{-}OFF}$ from the turn-off wave-shaping circuit 314, and/or the step signal $V_{STEP}$ from the step-up circuit 310. For example, the target voltage set circuit 316 may act as a combining circuit and combine one or more of the turn-on signal $V_{T\text{-}ON}$ from the turn-on wave-shaping circuit 312, the turn-off signal $V_{T\text{-}OFF}$ from the turn-off wave-shaping circuit 314, and/or the step signal $V_{STEP}$ from the step-up circuit 310 to generate the target signal $V_{TRGT}$. The target signal $V_{TRGT}$ may be used to control the FET Q330.

When rendering the FET Q330 conductive, the control circuit may be configured to drive the drive signal $V_{DR}$ high (e.g., towards the DC supply voltage $V_{CC}$) to generate a rising edge in the drive signal $V_{DR}$. In response to the rising edge of the drive signal $V_{DR}$, the target voltage set circuit 316 may set the target voltage $V_{TRGT}$ to be equal to the turn-on signal $V_{T\text{-}ON}$ during the turn-on period $T_{T\text{-}ON}$. As noted above, the turn-on signal $V_{T\text{-}ON}$ may be shaped. The target voltage set circuit 316 may set the magnitude of the target voltage $V_{TRGT}$ to be equal to the rated current magnitude $V_{I\text{-}RTD}$ at the end of the turn-on period $T_{T\text{-}ON}$. When the magnitude of the target signal $V_{TRGT}$ is equal to the rated current magnitude $V_{I\text{-}RTD}$ at the end of the turn-on period $T_{T\text{-}ON}$, the gate drive circuit 300 may attempt to control the magnitude of the load current $I_{LOAD}$ to a maximum rated current $I_{RATED}$ (e.g., approximately 10 A).

After the delay period $T_{DELAY}$, the target voltage set circuit 316 may set the target signal $V_{TRGT}$ to e equal to a maximum current magnitude $V_{I\text{-}MAX}$ (e.g., a maximum current value) in response to the step signal $V_{STEP}$ (e.g., to be equal to the magnitude of the step signal $V_{STEP}$). For example, the maximum current magnitude $V_{I\text{-}MAX}$ may be approximately 15 volts). The delay period $T_{DELAY}$ may be approximately equal to (e.g., equal to) the turn-on period $T_{T\text{-}ON}$, such that the target voltage signal $T_{TRGT}$ is set to the magnitude of the step signal $V_{STEP}$ after the turn-on period $T_{T\text{-}ON}$. When the magnitude of the target signal $V_{TRGT}$ is equal to the maximum current magnitude $V_{I\text{-}MAX}$ after the turn-on period $T_{T\text{-}ON}$, the gate drive circuit 300 may attempt to control the magnitude of the load current $I_{LOAD}$ to a maximum current level $I_{MAX}$ (e.g., approximately 20 A).

When rendering the FET Q330 non-conductive, the control circuit may be configured to drive the drive signal $V_{DR}$ low (e.g., to approximately circuit common) to generate a falling edge in the drive signal $V_{DR}$. In response to the falling edge of the drive signal $V_{DR}$, the gate drive circuit 300 may be configured to decrease (e.g., start decreasing) the magnitude of the target voltage $V_{TRGT}$ with respect to time. More specifically, when turning-off, the target voltage set circuit 316 may set the target voltage $V_{TRGT}$ to be equal to the turn-off signal $V_{T\text{-}OFF}$. For example, the turn-off wave-shaping circuit 314 may set the magnitude of the turn-off signal $V_{T\text{-}OFF}$ to a predetermined value, e.g., approximately the rated current magnitude $V_{I\text{-}RTD}$, which may be approximately 50% of the maximum current magnitude $V_{I\text{-}MAX}$ (e.g., from approximately 15V to 7.5V). Thereafter, the turn-off wave-shaping circuit 314 may gradually decrease the magnitude of the turn-off signal $V_{T\text{-}OFF}$ until the turn-off wave-shaping circuit 314 the drain voltage signal $V_{DV}$ from the drain voltage sense circuit 328 indicates that the voltage across the FET 330 is starting to rise (e.g., has exceeding a drain voltage threshold $V_{TH}$ indicating that the FET is starting to become non-conductive). Once the magnitude of the voltage developed across the FET Q330 as indicated by the drain voltage signal $V_{DV}$ exceeds the drain voltage threshold $V_{TH}$, the turn-off wave-shaping circuit 314 may begin to shape the turn-off signal $V_{T\text{-}OFF}$ from the present magnitude (e.g., the magnitude at the time the drain voltage signal $V_{DV}$ indicates that the magnitude of the voltage across the FET 330 has exceeded the drain voltage threshold $V_{TH}$) to zero volts. The target voltage set circuit 316 may set the target voltage $V_{TRGT}$ to be equal to the turn-off signal $V_{T\text{-}OFF}$.

The gate drive circuit 300 may include an operational amplifier circuit 318. The operational amplifier circuit 318 may having a non-inverting input configured to receive the target signal $V_{TRGT}$ from the target voltage set circuit 316 and an inverting input configured to receive the feedback signal $V_{I\text{-}FB}$ from the sense resistor R332. The operational amplifier circuit 318 may generate the gate control signal $V_{GC}$ at an output based on the target signal $V_{TRGT}$ and the feedback signal $V_{I\text{-}FB}$. For example, the operational amplifier circuit 318 may adjust the gate control signal $V_{GC}$ to control the FET Q330 and thus control the magnitude of the load current $I_{LOAD}$ towards a target current indicated by the magnitude of the target signal $V_{TRGT}$. The operational amplifier circuit 318 may be referenced to circuit common of the gate drive circuit 300 (e.g., to which the feedback signal $V_{I\text{-}FB}$ is referenced). As previously mentioned, the magnitude of the feedback signal $V_{I\text{-}FB}$ may be proportional to the magnitude of the load current $I_{LOAD}$. Accordingly, the operational amplifier circuit 318 may control the magnitude of the gate control signal $V_{GC}$ in response to the magnitude of the load current $I_{LOAD}$. Some lighting loads, such as LED light sources, may be capacitive loads, which may cause changes in a load voltage (e.g., a dimmed-hot voltage) across the lighting load that are not representative of the magnitude of the load current $I_{LOAD}$ (e.g., proportional to the magnitude of the load current $I_{LOAD}$). Since both the sense resistor R332 and the operational amplifier circuit 318 are referenced to circuit common, the operational amplifier circuit 318 may be responsive to (e.g., only responsive to)

the magnitude of the load current $I_{LOAD}$ and not influenced by the magnitude of the load voltage across the lighting load.

The gate drive circuit 300 may include a buffer circuit 326. The buffer circuit 326 may be coupled in series between the output of the operational amplifier circuit 318 and the gate of the FET Q330. The buffer circuit 326 may receive the control signal $V_{GC}$ from the voltage amplifier circuit 318 and may buffer the control signal $V_{GC}$ to generate a gate voltage $V_G$. The gate signal $V_G$ may control conductivity of the FET Q330. For example, the gate signal $V_G$, via the gate control signal $V_{GC}$, may render the FET Q330 conductive and non-conductive. In some examples, the gate drive circuit 300 may not include the buffer circuit 326.

The gate drive circuit may include an overcurrent detection circuit 322 and an overcurrent protection circuit 324. The overcurrent detection circuit 322 may detect an overcurrent condition. For example, the overcurrent detection circuit 322 may detect the overcurrent condition when the load current $I_{LOAD}$ (e.g., the magnitude of the load current) conducted through the FET Q330 (e.g., and through the electrical load) reaches the maximum current level $I_{MAX}$. Since the magnitude of the gate control signal $V_{GC}$ indicates the desired magnitude of the load current $I_{LOAD}$, the overcurrent detection circuit 322 may receive the gate control signal $V_{GC}$ and may determine whether an overcurrent condition is occurring in response to the magnitude of the gate control signal $V_{GC}$. The overcurrent detection circuit 322 may receive the step up signal $V_{STEP}$ and may begin to monitor for the overcurrent condition in response to the step up signal $V_{STEP}$ (e.g., after the step up signal $V_{STEP}$ is driven high when rendering the FET Q330 conductive). For example, the overcurrent detection circuit 322 may determine that an overcurrent condition has occurred when the gate control signal $V_{GC}$ is at the maximum current magnitude $V_{I\text{-}MAX}$ for a predetermined period of time.

The overcurrent detection circuit 322 may generate a signal (e.g., an overcurrent detection signal $V_{OCD}$) that may be received by the control circuit. When the overcurrent detection circuit 322 detects an overcurrent condition, the overcurrent detection circuit 322 may drive the magnitude of the overcurrent detect signal $V_{OCD}$ high to indicate the overcurrent condition to the control circuit. For example, the overcurrent detection signal $V_{OCD}$ may be coupled to the control circuit via an optocoupler (not shown). The control circuit may use the overcurrent detect signal $V_{OCD}$ to provide feedback to a user regarding the overcurrent condition. For example, the load control device 100 of FIG. 1 may provide feedback to the user about the overcurrent condition via the user interface 130.

The overcurrent protection circuit 324 may receive the overcurrent detect signal $V_{OCD}$ from the overcurrent detection circuit 322, the drain voltage signal $V_{DV}$ from the drain voltage sense circuit 328, and the drive signal $V_{DR}$ from the control circuit. The overcurrent protection circuit 324 may control the voltage amplifier circuit 318 to render the FET Q330 non-conductive after a trip time period $T_{TRIP}$ from when the overcurrent condition is detected (e.g., from when the overcurrent detect signal $V_{OCD}$ is driven high by the overcurrent protection circuit 324). For example, the overcurrent protection circuit 324 may generate an overcurrent protection signal $V_{OCP}$ that may be received by the target voltage set circuit 316. When the overcurrent protection circuit 324 detects that the magnitude of the gate control signal $V_{GC}$ is at the maximum current magnitude $V_{I\text{-}MAX}$ for a trip time period $T_{TRIP}$ after the overcurrent condition is detected, the overcurrent protection circuit 324 may control the overcurrent protection signal $V_{OCP}$ to render the FET Q330 non-conductive. The overcurrent protection circuit 324 may render the FET Q330 non-conductive by controlling the target voltage set circuit 316 to set the magnitude of the target voltage $V_{TRGT}$ to zero volts to cause the operational amplifier circuit 318 to drive the magnitude of the gate control signal $V_{GC}$ to zero volts when the overcurrent condition is detected. After the overcurrent protection circuit 324 has caused the operational amplifier circuit 318 to drive the magnitude of the gate control signal $V_{GC}$ to zero volts, the overcurrent protection circuit 324 may remain latched in the overcurrent state. The overcurrent protection circuit 324 may be reset from being latched in the overcurrent state in response to the drive signal $V_{DR}$ (e.g., when the drive signal $V_{DR}$ is driven low to render the FET Q330 non-conductive).

The overcurrent protection circuit 324 may determine the length of the trip time period based on a parameter of the FET Q330. The length of the trip time period may be associated with a safe operating area of the FET Q330. For example, the parameter of the FET Q330 may include a temperature of the FET, a power dissipation of the FET, a voltage developed across the FET, and/or the like. Based on the parameter, the overcurrent protection circuit 324 may determine the length of trip time period to render the FET Q330 non-conductive after the overcurrent condition is detected. For example, the overcurrent protection circuit 324 may be configured to determine the magnitude of the voltage developed across the FET Q330 in response to drain voltage signal $V_{DV}$ from the drain voltage sense circuit 328.

The length of the trip time period may be inversely proportional to the parameter of the FET Q330. For example, the overcurrent protection circuit 324 may have a shorter length of the trip time period when the parameter (e.g., temperature, power, and/or voltage) is high, and may have a longer length of the trip time period when the parameter (e.g., temperature, power, and/or voltage) is low. Accordingly, the overcurrent protection circuit 324 may render the FET Q330 conductive faster by having a shorter length of the trip time period when, for example, an overcurrent condition may be occurring. In addition, the overcurrent protection circuit 324 may render the FET Q330 conductive slower by having a longer length of the trip time period (e.g., to allow for conduction of inrush current for a longer period of time). By allowing the FET Q330 to be conductive in a current half cycle for a longer period of time to conduct inrush current, the gate drive circuit 300 may charge an input capacitance of the electrical load to a greater level and reduce the amount of inrush current that may be conducting during the next half cycle.

The gate drive circuit 300 may include an isolated power supply 320. The isolated power supply 320 may generate an isolated supply voltage $V_{SUP}$ (e.g., approximately 15 V) for providing power to the gate drive circuit 300 and drive the FET Q330. The isolated power supply 320 may be independent from a power supply used for the remaining components of the load control device, such as the power supply 140 shown in FIGS. 1 and 2. For example, each of the controllably conductive devices 110, 120 shown in FIGS. 1 and 2 may comprise an individual isolated power supply. Alternatively, the load control device may include a single power supply, and as such, the isolated power supply 320 may be omitted.

When the load control device comprises multiple load control circuits (e.g., such as the first and second load control circuits 110, 120 of the load control device 100), a single lighting load may be connected to two or more the dimmed-hot terminals (e.g., as shown in FIG. 2), such that the load control circuits are coupled in parallel and share the load current (e.g., may each conduct at least a portion of a load current $I_{LOAD}$ through the lighting load). This may allow the load control device to control a lighting load having a high power rating than when lighting loads are individually coupled to the dimmed-hot terminals (e.g., as shown in FIG. 1).

Each of the multiple load control circuit includes respective closed-loop drive circuit for each of the semiconductor switches. The closed-loop drive circuits each operate to limit the magnitude of the portion of the load current being conducted through the respective semiconductor switch to the maximum current level $I_{MAX}$ (e.g., as described above with reference to the gate drive circuit 300 of FIG. 3). The control circuit 115 may generate respective drive signals to control the respective semiconductor switches of each of the load control circuits in unison (e.g., with identical drive signals as described above with reference to FIG. 2). However, due to tolerances of the components of the gate drive circuits, there may be different hardware delays between when the drive signals are driven high to render the semiconductor switches conductive and each of semiconductor switches are rendered conductive. For example, if the first FET Q112 of the first load control circuit 110 becomes conductive before (e.g., even slightly before) the FET Q122 of the second load control circuit 120, the FET Q112 may attempt to conduct (e.g., briefly conduct) all of the load current $I_{LOAD}$ (e.g., which may be very large, particularly during an inrush current condition). Because the first closed-loop gate circuit 116 may limit the magnitude of the load current $I_{LOAD}$ conducted through the first FET Q112 to the maximum current level $I_{MAX}$, the first FET Q112 may not be damaged and may continue to conduct (e.g., briefly conduct) the load current $I_{LOAD}$ at the maximum current level $I_{MAX}$ until the second FET Q112 becomes conductive.

Figure 4:
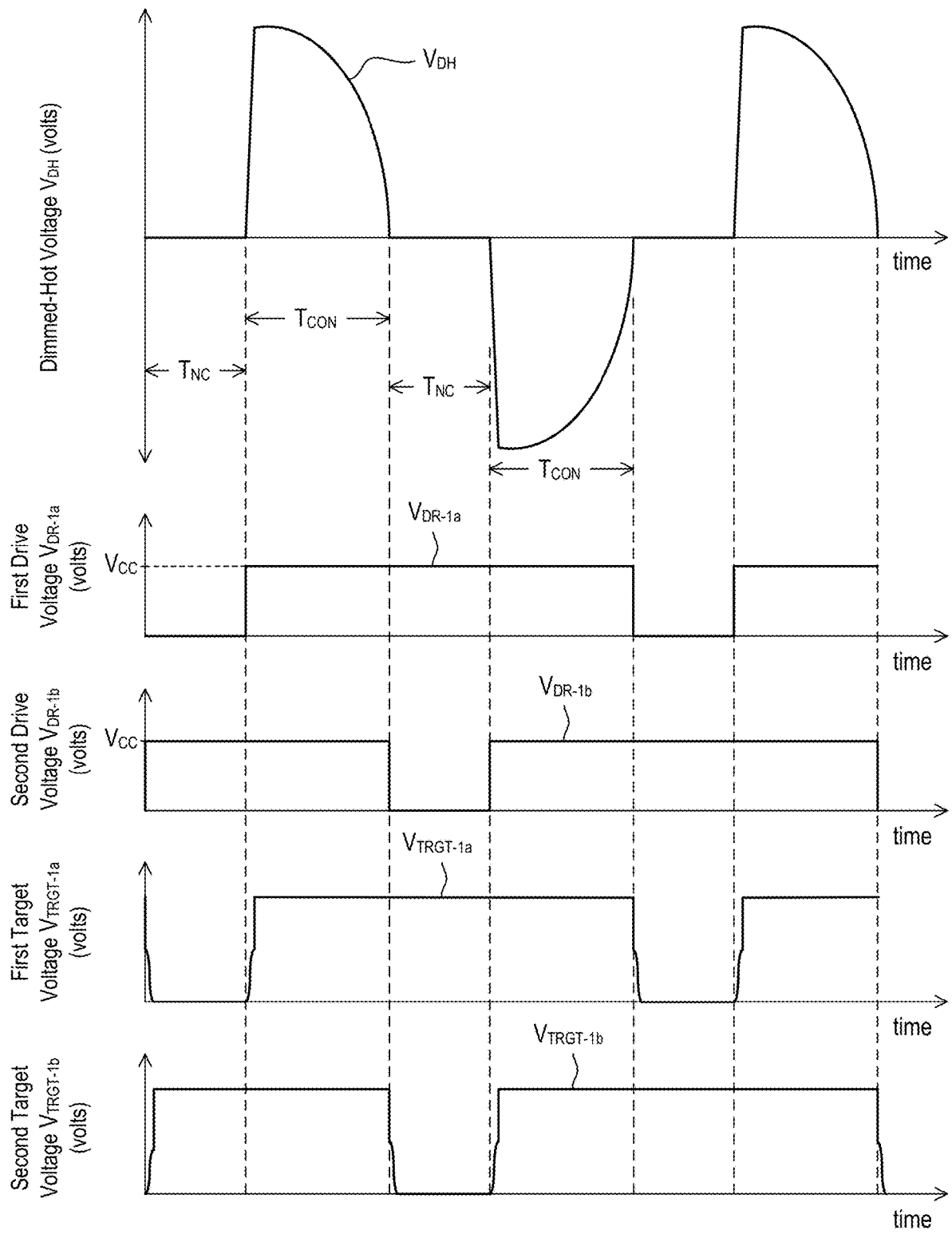
FIG. 4 shows examples of waveforms that illustrate an operation of a load control device using a forward phase-control dimming technique.

FIG. 4 shows examples of waveforms that illustrate an operation of a load control device (e.g., the load control device 100 shown in FIGS. 1 and 2) using a forward phase-control dimming technique. As described herein, the load control device may receive an AC voltage from an AC power source and may generate a dimmed-hot voltage $V_{DH}$ at a dimmed-hot terminal of the load control device. Using the forward phase-control dimming technique and as shown in FIG. 4, a control circuit may render a controllably conductive device non-conductive at the beginning of each half cycle (e.g., during a non-conductive period $T_{NC}$), render the controllably conductive device conductive at a firing time during the half cycle, and maintain the controllably conductive device non-conductive until the end of the half cycle (e.g., during a conductive period $T_{CON}$). For example, the controllably conductive device may comprise two semiconductor switches, such as in anti-series connection. Further, it should be appreciated that the slope of the dimmed-hot voltage $V_{DH1}$ when transitioning from and to zero volts as shown in FIGS. 4-9 is exaggerated for illustrated purposes.

The control circuit may generate a drive signal to control the conductivity of the controllably conductive device. For example, the control circuit may generate a first drive signal $V_{DR-1a}$ to render a first semiconductor switch (e.g., the first FET Q112 of the first controllably conductive device 110) conductive during the positive half cycles, and may generate a second drive signal $V_{DR-1b}$ to render a second semiconductor switch (e.g., the second FET Q114 of the first controllably conductive device 120) conductive during the negative half cycles. The first and second drive signals $V_{DR-1a}$, $V_{DR-1b}$ may be pulse-width modulated signals.

The load control device may generate target signals (e.g., a first target signal $V_{TRGT-1a}$ and a second target signal $V_{TRGT-1b}$) in response to the control circuit. For example, as described herein, a first gate drive circuit of the load control device (e.g., the first gate drive circuit 116) may receive the first drive signal $V_{DR-1a}$, which may be driven high at a firing time during the positive half cycles of the AC voltage. The first gate drive circuit may start to shape the first target signal $V_{TRGT-1a}$ in response to the first drive signal $V_{DR-1a}$, and may shape the first target signal $V_{TRGT-1a}$ during a turn-on time period. The first gate drive circuit may use the first target signal $V_{TRGT-1a}$ to render the first semiconductor switch conductive and maintain the first semiconductor switch conductive during the remainder of the positive half cycles. Similarly, a second gate drive circuit of the load control device (e.g., the second gate drive circuit 118) may receive the second drive signal $V_{DR-1b}$, which may be driven high at a firing time during the negative half cycles of the AC voltage. The second gate drive circuit may shape the second target signal $V_{TRGT-1b}$ in response to the second drive signal $V_{DR-1b}$, and may shape the second target signal $V_{TRGT-1b}$ during a turn-on time period. The second gate drive circuit may use the second target signal $V_{TRGT-1b}$ to render the second semiconductor switch conductive and maintain the second semiconductor switch conductive during the remainder of the negative half cycles.

Further, at the end of the negative half cycles of the AC voltage (e.g., near a zero-crossing of the AC voltage), the first drive signal $V_{DR-1a}$ may be driven low by the control circuit, and the first gate drive circuit may shape the first target signal $V_{TRGT-1a}$ during a turn-off time period. Similarly, at the end of the positive half cycles of the AC voltage (e.g., near a zero-crossing of the AC voltage), the second drive signal $V_{DR-1b}$ may be driven low by the control circuit, and the second gate drive circuit may shape the second target signal $V_{TRGT-1b}$ during a turn-off time period. Accordingly, the first and second target signals $V_{TRGT-1a}$, $V_{TRGT-1b}$ may be shaped on their rising and falling edges. Alternatively, the first and second target signals $V_{TRGT-1a}$, $V_{TRGT-1b}$ may only be shaped on their rising edges and not their falling edges when using the forward phase-control dimming technique.

Figure 5:
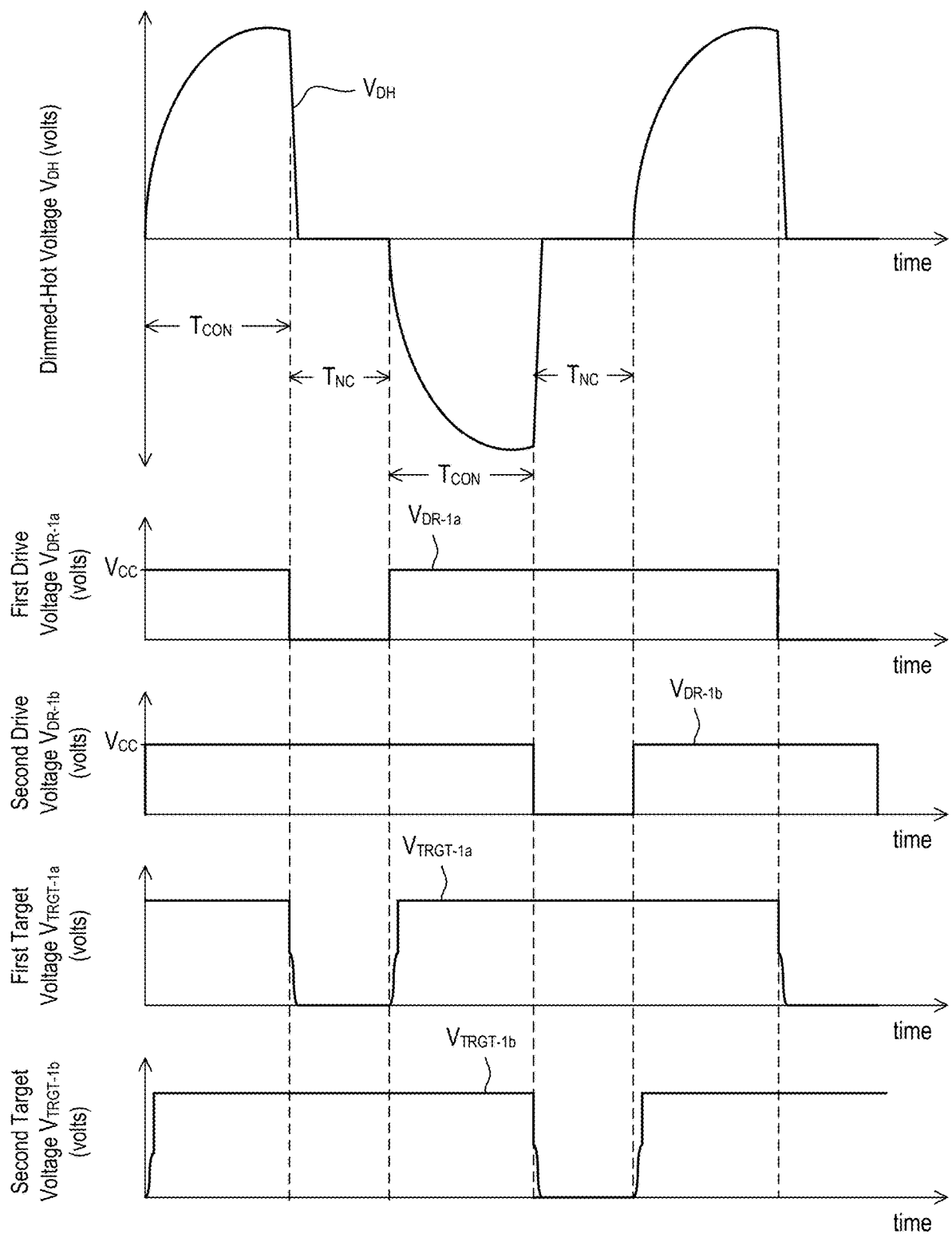
FIG. 5 shows examples of waveforms that illustrate an operation of a load control device using a reverse phase-control dimming technique.

FIG. 5 shows examples of waveforms that illustrate an operation of a load control device (e.g., the load control device 100 shown in FIGS. 1 and 2) using a reverse phase-control dimming technique. Similar to the operation of the load control device with a forward phase-control dimming technique described herein, the load control device may receive an AC voltage from an AC power source and may generate a dimmed-hot voltage $V_{DH1}$ at a dimmed-hot terminal of the load control device. Using the reverse phase-control dimming technique and as shown in FIG. 5, a control circuit may render a controllably conductive device conductive at the beginning of each half cycle (e.g., during a conductive period $T_{CON}$), render the controllably conductive device non-conductive at a firing time (during the half cycle, and maintain the controllably conductive device conductive until the end of the half cycle (e.g., during a non-conductive period $T_{NC}$). For example, the controllably conductive device may comprise two semiconductor switches, such as in anti-series connection.

The control circuit may generate a drive signal to control the conductivity of the controllably conductive device. For example, the control circuit may generate a first drive signal $V_{DR-1a}$ to render a first semiconductor switch (e.g., the first FET Q112 of the first controllably conductive device 110) conductive during the positive half cycles. The control circuit may generate a second drive signal $V_{DR-1b}$ to render a second semiconductor switch (e.g., the second FET Q114 of the second controllably conductive device) conductive during the negative half cycles. As noted above, the first and second drive signals $V_{DR-1a}$, $V_{DR-1b}$ may be pulse-width modulated signals.

The load control device may generate target signals (e.g., a first target signal $V_{TRGT-1a}$ and a second target signal $V_{TRGT-1b}$) in response to the control circuit. For example, as described herein, a first gate drive circuit of the load control device (e.g., the first gate drive circuit 116) may receive the first drive signal $V_{DR-1a}$, which may be high at the beginning of the positive half cycles, such that the controllably conductive device is conductive at the beginning of the positive half cycles. The first drive signal $V_{DR-1a}$ may be driven low at a firing time during the positive half cycles of the AC voltage. The first gate drive circuit may being to shape the first target signal $V_{TRGT-1a}$ in response to the first drive signal $V_{DR-1a}$, and may shape the first target signal $V_{TRGT-1a}$ during a turn-off time period. The first gate drive circuit may use the first target signal $V_{TRGT-1b}$ to render the first semiconductor switch non-conductive and maintain the first semiconductor switch non-conductive during the remainder of the positive half cycles. Similarly, a second gate drive circuit of the load control device (e.g., the second gate drive circuit 118) may receive the second drive signal $V_{DR-1b}$, which may be high at the beginning of the negative half cycles, such that the controllably conductive device is conductive at the beginning of the negative half cycles. The second drive signal $V_{DR-1b}$ may be driven low at a firing time during the negative half cycles of the AC voltage. The load control device may begin to shape the first target signal $V_{TRGT-1a}$ in response to the second drive signal $V_{DR-1b}$, and may shape the second target signal $V_{TRGT-1b}$ during a turn-off time period. The second gate drive circuit may use the second target signal $V_{TRGT-1b}$ to render the second semiconductor switch non-conductive during the remainder of the negative half cycles.

Further, at the end of the positive half cycles of the AC voltage (e.g., near a zero-crossing of the AC voltage), the first drive signal $V_{DR-1a}$ may be driven high by the control circuit, and the first gate drive circuit may shape the first target signal $V_{TRGT-1a}$ during a turn-on time period. Similarly, at the end of the negative half cycles of the AC voltage (e.g., near a zero-crossing of the AC voltage), the second drive signal $V_{DR-1b}$ by be drive high by the control circuit, and the second gate drive circuit may shape the second target signal $V_{TRGT-1b}$ during a turn-on time period. Accordingly, the first and second target signals $V_{TRGT-1a}$, $V_{TRGT-1b}$ may be shaped on their rising and falling edges. Alternatively, the first and second target signals $V_{TRGT-1a}$, $V_{TRGT-1b}$ may only be shaped on their falling edges and not their rising edges when using the reverse phase-control dimming technique.

Figure 6:
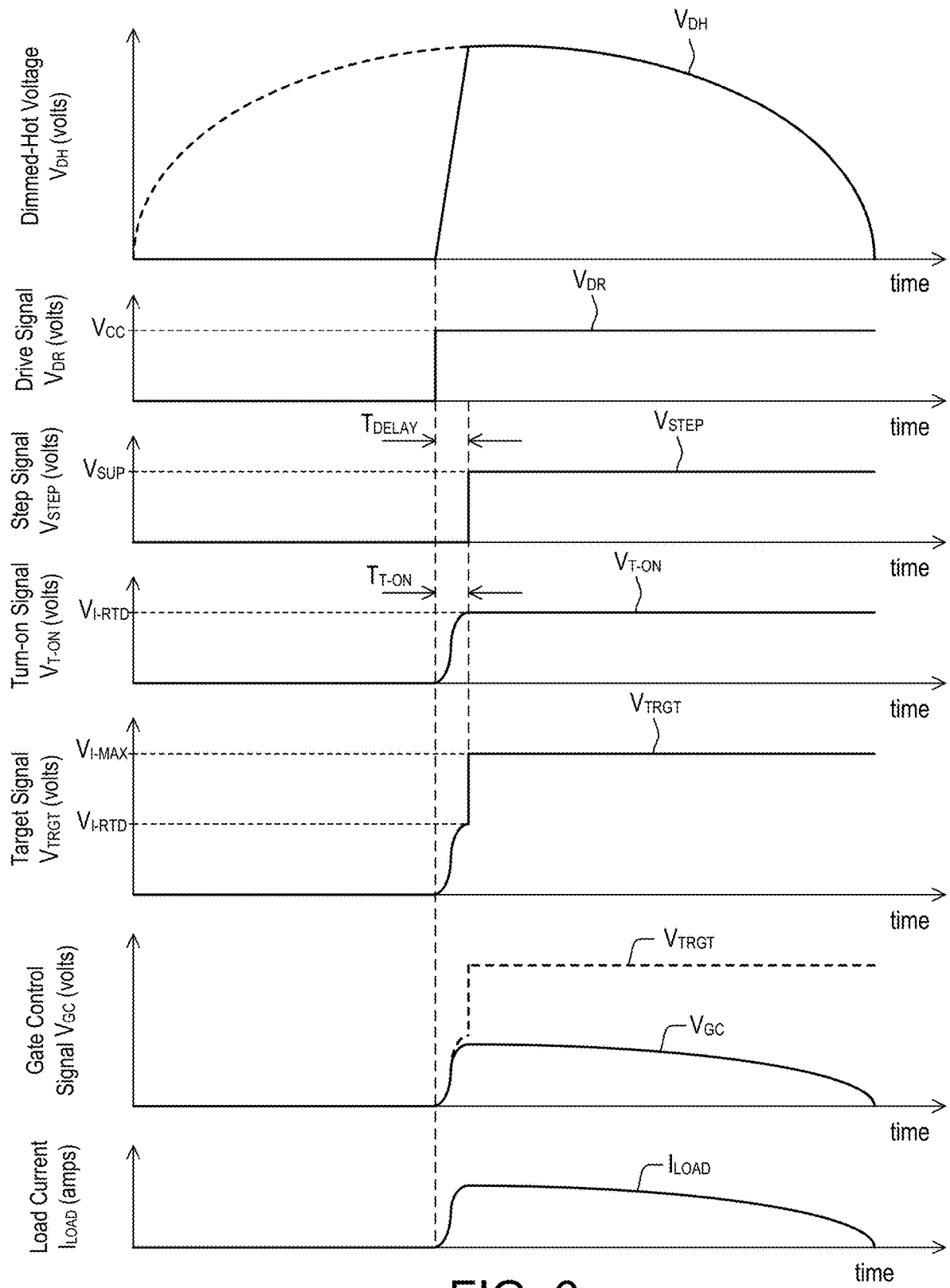
FIG. 6 shows examples of waveforms that illustrate an operation of a gate drive circuit to render a semiconductor switch conductive using a forward phase-control dimming technique.

FIG. 6 shows examples of waveforms that illustrate an operation of a gate drive circuit (e.g., the gate drive circuit 300) to render a semiconductor switch (e.g., the FET Q330) conductive using a forward phase-control dimming technique. As described herein, a load control device (e.g., the load control device 100 of FIGS. 1 and 2) may receive an AC mains line voltage from an AC power source and may phase control the AC line voltage to generate a dimmed-hot voltage $V_{DH}$ (e.g., a phase-control voltage) at a dimmed-hot terminal of the load control device. The load control device may comprise two gate drive circuits with a first gate drive circuit (e.g., the first gate drive circuit 116 shown in FIG. 1) controlling a first semiconductor switch (e.g., the first FET Q112) in the positive half-cycles (e.g., as shown in FIG. 6) and a second gate drive circuit (e.g., the second gate drive circuit 118 shown in FIG. 1) controlling a second semiconductor switch (e.g., the second FET Q114) in the negative half-cycles. The operation of the second gate drive circuit in the negative half cycles may be the same as the operation of the first gate drive circuit in the positive half cycles as shown in FIG. 6.

The gate drive circuit of the load control device may receive a drive signal $V_{DR}$ from a control circuit (e.g., the control circuit 115). The control circuit may drive the drive signal $V_{DR}$ high (e.g., towards the DC supply voltage $V_{CC}$) at a firing time $t_{FIRE}$. The gate drive circuit may generate a step signal $V_{STEP}$ using a step-up circuit (e.g., the step-up circuit 310). The step-up circuit may receive the drive signal $V_{DR}$ from the control circuit and may drive the magnitude of the step signal $V_{STEP}$ high (e.g., towards the isolated supply voltage $V_{SUP}$) after a delay period $T_{DELAY}$ from when the drive signal $V_{DR}$ was driven high.

The gate drive circuit may generate a target signal $V_{TRGT}$ in response to the drive signal $V_{DR}$ from the control circuit. The gate drive circuit may begin to shape the target signal $V_{TRGT}$ in response to the drive signal $V_{DR}$ being driven high and may shape the target signal $V_{TRGT}$ over a turn-on period $T_{T-ON}$ (e.g., approximately 50 μsec). The gate drive circuit may generate the target signal $V_{TRGT}$ using a turn-on signal $V_{T-ON}$ generated by a turn-on wave-shaping circuit (e.g., the turn-on wave-shaping circuit 312). The gate drive circuit may shape the turn-on signal $V_{T-ON}$ in order to shape the target signal $V_{TRGT}$. Accordingly, in some examples, the turn-on signal $V_{T-ON}$ may be defined by an "S" shape over the turn-on period $T_{T-ON}$. The gate drive circuit may control the magnitude of the turn-on signal $V_{T-ON}$ to a rated current magnitude $V_{I-RTD}$ (e.g., approximately 7.5 volts) at the end of the turn-on period $T_{T-ON}$. The gate drive circuit may set the target signal $V_{TRGT}$ to be equal to the magnitude of the turn-on signal $V_{T-ON}$ during the turn-on period $T_{T-ON}$. When the step signal $V_{STEP}$ is driven high after the delay period $T_{DELAY}$, the gate drive circuit may set the target signal $V_{TRGT}$ to a predetermined level, such as a maximum current magnitude $V_{I-MAX}$, which may be equal to the magnitude of the step signal $V_{STEP}$ (e.g., approximately 15V). For example, the delay period $T_{DELAY}$ may be approximately equal to the turn-on period $T_{T-ON}$, such that the target voltage signal $T_{TRGT}$ is set to the magnitude of the step signal $V_{STEP}$ after the turn-on period $T_{T-ON}$.

The gate drive circuit may generate a gate control signal $V_{GC}$ based on the target signal $V_{TRGT}$ and a feedback signal $V_{I-FB}$ (not shown) that indicates a magnitude of a load current conducted through the semiconductor switch. The gate drive circuit may adjust a magnitude of the gate control signal $V_{GC}$ in response to the magnitude of the feedback signal $V_{I-FB}$. For example, the gate drive circuit may adjust the magnitude of the gate control signal $V_{GC}$ in response to a magnitude of the feedback signal $V_{I-FB}$ to adjust a magnitude of the load current $I_{LOAD}$ toward a target current, where for example, the target current is indicated by a magnitude of the target signal $V_{TRGT}$.

When the magnitude of the target signal $V_{TRGT}$ is equal to the rated current magnitude $V_{I-RTD}$ at the end of the turn-on period $T_{T-ON}$, the gate drive circuit may control the magnitude of the gate control signal $V_{GC}$ to attempt to control the magnitude of the load current $I_{LOAD}$ to a maximum rated current $I_{RATED}$ (e.g., approximately 10 A). However, the lighting load may not require the maximum rated current $I_{RATED}$ (e.g., the lighting load may be a lower power lighting load), and the magnitude of the gate control signal $V_{GC}$ may deviate from the magnitude of the target signal $V_{TRGT}$ before the magnitude of the gate control signal $V_{GC}$ reaches the rated current magnitude $V_{I-RTD}$ as shown in FIG. 6. When the magnitude of the target signal $V_{TRGT}$ is equal to the maximum current magnitude $V_{I-MAX}$ after the delay period $T_{DELAY}$, the gate drive circuit may control the magnitude of the gate control signal $V_{GC}$ to attempt to control the magnitude of the load current $I_{LOAD}$ to a maximum current level $I_{MAX}$ (e.g., approximately 20 A). However, if the lighting load is not experiencing an overcurrent event (e.g., when the lighting load is shorted) or an inrush current event (e.g., when conducting an inrush current to the lighting load), the magnitude of the gate control signal $V_{GC}$ may not be driven up to the maximum current magnitude $V_{I-MAX}$ as shown in FIG. 6.

Since the gate drive circuit is using closed-loop control to adjust the magnitude of the gate control signal $V_{GC}$ based on the feedback signal $V_{I-FB}$, the magnitude of the gate control signal $V_{GC}$ may indicate (e.g., be proportional to) the present magnitude of the load current $I_{LOAD}$. As a result, the load current $I_{LOAD}$ may have the same shape as the gate control signal $V_{GC}$ as shown in FIG. 6.

Figure 7:
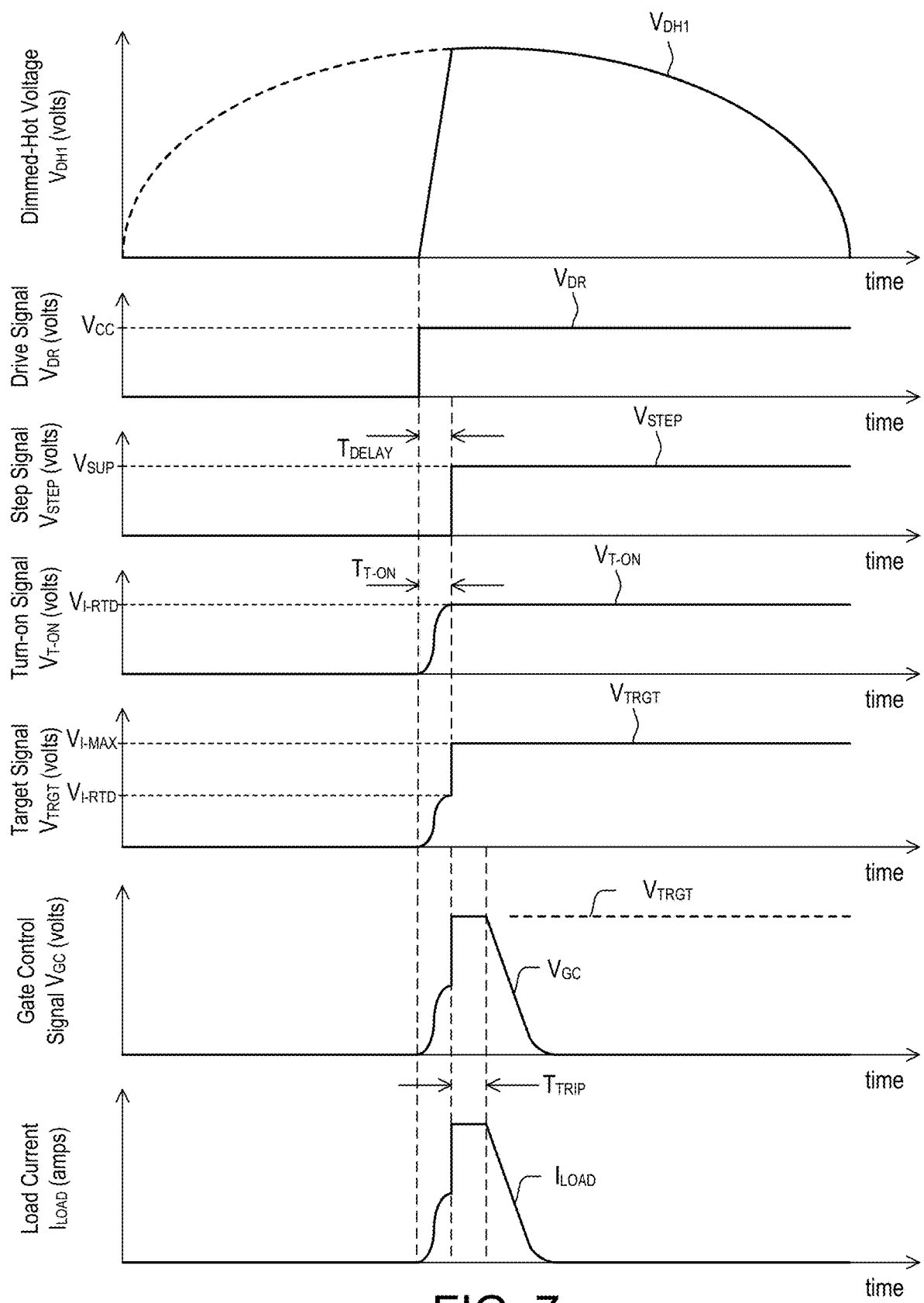
FIG. 7 shows examples of waveforms that illustrate an operation of a gate drive circuit to render a semiconductor switch conductive using a forward phase-control dimming technique when the semiconductor switch is experiencing an overcurrent condition.

FIG. 7 shows examples of waveforms that illustrate an operation of a gate drive circuit (e.g., the gate drive circuit 300) to render a semiconductor switch (e.g., the FET Q330) conductive using a forward phase-control dimming technique when the semiconductor switch is experiencing an overcurrent condition (e.g., when a lighting load controlled by the semiconductor switch may be shorted). As described herein, a load control device (e.g., the load control device 100 of FIGS. 1 and 2) may receive an AC line voltage from an AC power source and may phase control the AC line voltage to generate a dimmed-hot voltage $V_{DH}$ (e.g., a phase-control voltage) at a dimmed-hot terminal of the load control device. The load control device may comprise two gate drive circuits with a first gate drive circuit (e.g., the first gate drive circuit 116 shown in FIG. 1) controlling a first semiconductor switch (e.g., the first FET Q112) in the positive half-cycles (e.g., as shown in FIG. 7) and a second gate drive circuit (e.g., the second gate drive circuit 118 shown in FIG. 1) controlling a second semiconductor switch (e.g., the second FET Q114) in the negative half-cycles. The operation of the second gate drive circuit during an overcurrent condition (e.g., a short circuit condition) in the negative half cycles may be the same as the operation of the first gate drive circuit in the positive half cycles as shown in FIG. 7.

The gate drive circuit of the load control device may receive a drive signal $V_{DR}$ from a control circuit (e.g., the control circuit 115). The control circuit may drive the drive signal $V_{DR}$ high (e.g., towards the DC supply voltage $V_{CC}$) at a firing time $t_{FIRE}$. The gate drive circuit may generate a step signal $V_{STEP}$ using a step-up circuit (e.g., the step-up circuit 310). The step-up circuit may receive the drive signal $V_{DR}$ from the control circuit and may drive the magnitude of the step signal $V_{STEP}$ high (e.g., towards the isolated supply voltage $V_{SUP}$) after a delay period $T_{DELAY}$ from when the drive signal $V_{DR}$ was driven high.

The gate drive circuit may generate a target signal $V_{TRGT}$ in response to the drive signal $V_{DR}$ from the control circuit. The gate drive circuit may begin to shape the target signal $V_{TRGT}$ in response to the drive signal $V_{DR}$ being driven high and may shape the target signal $V_{TRGT}$ over a turn-on period $T_{T-ON}$. The gate drive circuit may generate the target signal $V_{TRGT}$ using a turn-on signal $V_{T-ON}$ generated by a turn-on wave-shaping circuit (e.g., the turn-on wave-shaping circuit 213). The gate drive circuit may shape the turn-on signal $V_{T-ON}$ in order to shape the target signal $V_{TRGT}$. Accordingly, in some examples, the turn-on signal $V_{T-ON}$ may be defined by an "S" shape over the turn-on period $T_{T-ON}$. The gate drive circuit may control the magnitude of the turn-on signal $V_{T-ON}$ to a rated current magnitude $V_{I-RTD}$ (e.g., approximately 7.5 volts) at the end of the turn-on period $T_{T-ON}$. The gate drive circuit may set the target signal $V_{TRGT}$ to be equal to the magnitude of the turn-on signal $V_{T-ON}$ during the turn-on period $T_{T-ON}$. When the step signal $V_{STEP}$ is driven high after the delay period $T_{DELAY}$, the gate drive circuit may set the target signal $V_{TRGT}$ to a predetermined level, such as a maximum current magnitude $V_{I-MAX}$, which may be equal to the magnitude of the step signal $V_{STEP}$ (e.g., approximately 15V). For example, the delay period $T_{DELAY}$ may be approximately equal to the turn-on period $T_{T-ON}$, such that the target voltage signal $T_{TRGT}$ is set to the magnitude of the step signal $V_{STEP}$ after the turn-on period $T_{T-ON}$.

The gate drive circuit may generate a gate control signal $V_{GC}$ based on the target signal $V_{TRGT}$ and a feedback signal $V_{I-FB}$ (not shown) that indicates a magnitude of a load current conducted through the semiconductor switch. The gate drive circuit may adjust a magnitude of the gate control signal $V_{GC}$ in response to the magnitude of the feedback signal $V_{I-FB}$. For example, the gate drive circuit may adjust the magnitude of the gate control signal $V_{GC}$ in response to a magnitude of the feedback signal $V_{I-FB}$ to adjust a magnitude of the load current $I_{LOAD}$ toward a target current, where for example, the target current is indicated by a magnitude of the target signal $V_{TRGT}$.

When the magnitude of the target signal $V_{TRGT}$ is equal to the rated current magnitude $V_{I-RTD}$ at the end of the turn-on period $T_{T-ON}$, the gate drive circuit may control the magnitude of the gate control signal $V_{GC}$ to attempt to control the magnitude of the load current $I_{LOAD}$ to a maximum rated current $I_{RATED}$ (e.g., approximately 10 A). During an overcurrent current condition (e.g., when the lighting load has failed shorted), the magnitude of the gate control signal $V_{GC}$ may follow the magnitude of the target signal $V_{TRGT}$ as shown in FIG. 7. When the magnitude of the target signal $V_{TRGT}$ is driven up to the maximum current magnitude $V_{I-MAX}$ after the delay period $T_{DELAY}$, the gate drive circuit may control the magnitude of the gate control signal $V_{GC}$ to attempt to control the magnitude of the load current $I_{LOAD}$ to a maximum current level $I_{MAX}$ (e.g., approximately 20 A). Because the lighting load may be shorted during the overcurrent condition, the magnitude of the gate control signal $V_{GC}$ may be driven up to the maximum current magnitude $V_{I-MAX}$ as shown in FIG. 7. Since the target signal $V_{TRGT}$ is maintained at the maximum current magnitude $V_{I-MAX}$, the magnitude of the load current $I_{LOAD}$ may be limited to the maximum current level $I_{MAX}$ during the overcurrent condition.

Since the gate drive circuit is using closed-loop control to adjust the magnitude of the gate control signal $V_{GC}$ based on the feedback signal $V_{I-FB}$, the magnitude of the gate control signal $V_{GC}$ may indicate (e.g., be proportional to) the present magnitude of the load current $I_{LOAD}$. As a result, the load current $I_{LOAD}$ may have the same shape as the gate control signal $V_{GC}$ as shown in FIG. 7. The gate drive circuit may detect an overcurrent condition, using an overcurrent detection circuit (e.g., the overcurrent detection circuit 322). The overcurrent detection circuit may detect the overcurrent condition in response to the gate control signal $V_{GC}$ (e.g., since the magnitude of the gate control signal $V_{GC}$ may indicate present magnitude of the load current $I_{LOAD}$). For example, the overcurrent detection circuit may detect the overcurrent condition when the magnitude of the gate control signal $V_{GC}$ is equal to the maximum current magnitude $V_{I-MAX}$.

During an overcurrent condition, the gate drive circuit may control the magnitude of the target signal $V_{TRGT}$ to turn off the semiconductor switch using an overcurrent protection circuit (e.g., the overcurrent protection circuit 324). The overcurrent protection circuit may control the magnitude of the target signal $V_{TRGT}$ to zero volts to render the semiconductor switch non-conductive after a trip time period $T_{TRIP}$ from when the overcurrent condition was detected (e.g., when the magnitude of the gate control signal $V_{GC}$ is equal to the maximum current magnitude $V_{I-MAX}$ immediately after the turn-on period $T_{T-ON}$ as shown in FIG. 7). For example, the gate drive circuit may maintain the semiconductor switch conductive during the duration of the trip time period $T_{TRIP}$ and render the semiconductor switch non-conductive at the conclusion of the trip time period $T_{TRIP}$ (e.g., if the overcurrent condition is still detected). For instance, at the end of the trip time period $T_{TRIP}$, the gate drive circuit may decrease (e.g., quickly decrease) the magnitude of the gate control signal $V_{GC}$ to zero volts (e.g., in response to the overcurrent protection circuit controlling the magnitude of the target signal $V_{TRGT}$ to zero volts), thereby rendering the semiconductor switch non-conductive.

The overcurrent protection circuit may determine the length of the trip time period $T_{TRIP}$. In some examples, the length of the trip time period may be fixed or predetermined. In other examples, the length of the trip time period $T_{TRIP}$ may be based on a parameter of the semiconductor switch. For example, the parameter of the semiconductor switch may include a temperature of the semiconductor switch, a power of the semiconductor switch, a voltage developed across the semiconductor switch, and/or the like. The trip time period $T_{TRIP}$ may be inversely proportional to the parameter of the semiconductor switch. For example, the overcurrent protection circuit may be configured to determine the magnitude of the voltage developed across the semiconductor switch in response to a drain voltage signal from a drain voltage sense circuit (e.g., the drain voltage sense circuit). If the magnitude of the voltage developed across the semiconductor switch is high, the trip time period $T_{TRIP}$ may be shorter in comparison to when the voltage developed across the semiconductor switch is low. During an overcurrent condition (e.g., when the lighting load may be shorted), the voltage developed across the semiconductor switch may be high and the trip time period $T_{TRIP}$ may be shorter. By rendering the semiconductor switch non-conductive quicker, the overcurrent current condition may be removed more quickly and the semiconductor switch may be protected during the overcurrent condition.

Figure 8:
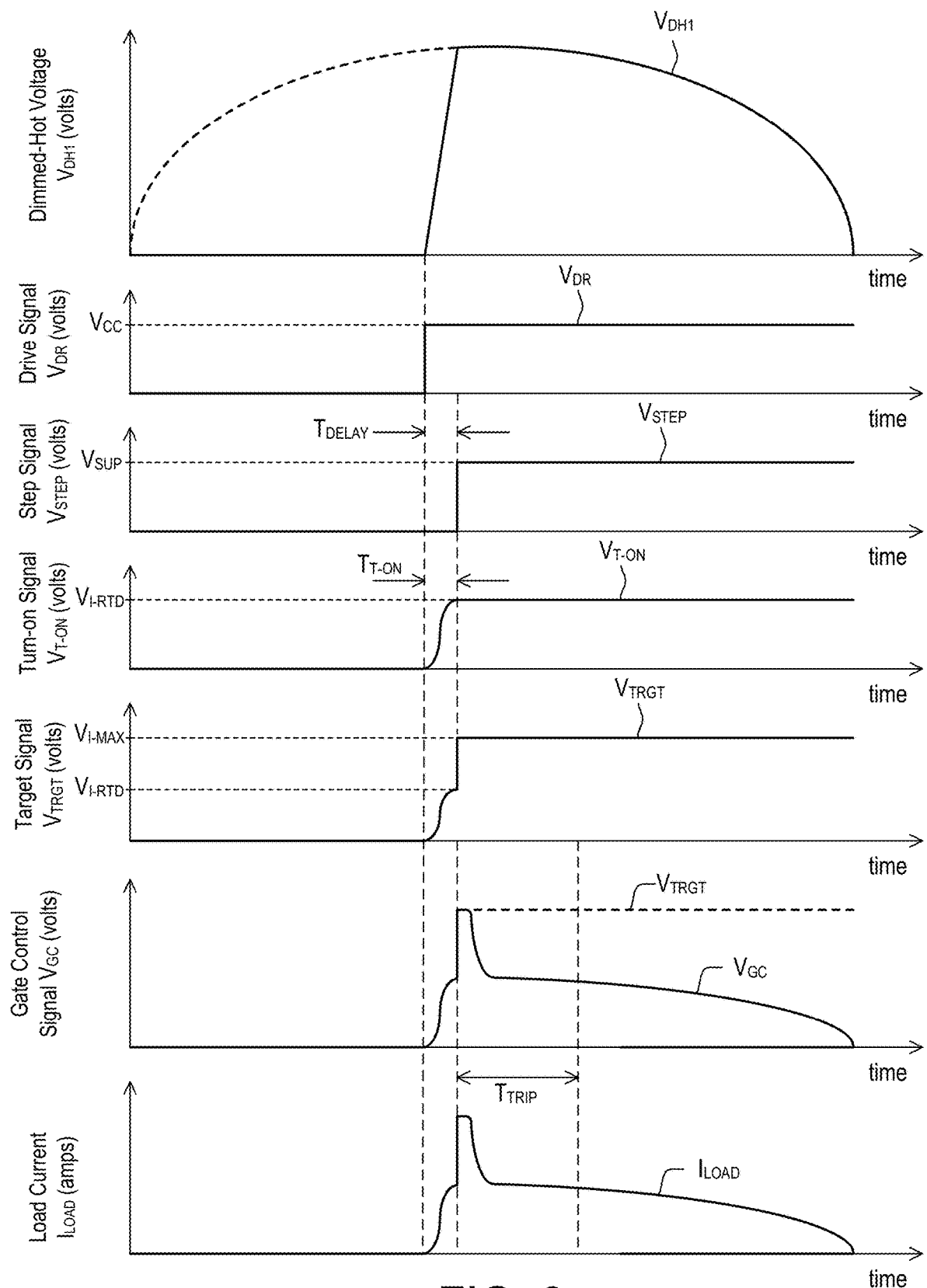
FIG. 8 shows examples of waveforms that illustrate an operation of a gate drive circuit to render a semiconductor switch conductive using a forward phase-control dimming technique when the semiconductor switch is experiencing an inrush current condition.

FIG. 8 shows examples of waveforms that illustrate an operation of a gate drive circuit (e.g., the gate drive circuit 300) to render a semiconductor switch (e.g., the FET Q330) conductive using a forward phase-control dimming technique when the semiconductor switch is experiencing an inrush current condition (e.g., to charge an input capacitance of a lighting load). As described herein, a load control device (e.g., the load control device 100 of FIGS. 1 and 2) may receive an AC line voltage from an AC power source and may phase control the AC line voltage to generate a dimmed-hot voltage $V_{DH}$ (e.g., a phase-control voltage) at a dimmed-hot terminal of the load control device. The load control device may comprise two gate drive circuits with a first gate drive circuit (e.g., the first gate drive circuit 116 shown in FIG. 1) controlling a first semiconductor switch (e.g., the first FET Q112) in the positive half-cycles (e.g., as shown in FIG. 8) and a second gate drive circuit (e.g., the second gate drive circuit 118 shown in FIG. 1) controlling a second semiconductor switch (e.g., the second FET Q114) in the negative half-cycles. The operation of the second gate drive circuit during an inrush current condition in the negative half cycles may be the same as the operation of the first gate drive circuit in the positive half cycles as shown in FIG. 8.

The gate drive circuit of the load control device may receive a drive signal $V_{DR}$ from a control circuit (e.g., the control circuit 115). The control circuit may drive the drive signal $V_{DR}$ high (e.g., towards the DC supply voltage $V_{CC}$) at a firing time $t_{FIRE}$. The gate drive circuit may generate a step signal $V_{STEP}$ using a step-up circuit (e.g., the step-up circuit 310). The step-up circuit may receive the drive signal $V_{DR}$ from the control circuit and may drive the magnitude of the step signal $V_{STEP}$ high (e.g., towards the isolated supply voltage $V_{SUP}$) after a delay period $T_{DELAY}$ from when the drive signal $V_{DR}$ was driven high.

The gate drive circuit may generate a target signal $V_{TRGT}$ in response to the control circuit. The gate drive circuit may begin to shape the target signal $V_{TRGT}$ in response to the drive signal $V_{DR}$ being driven high and may shape the target signal $V_{TRGT}$ over a turn-on period $T_{T-ON}$. The gate drive circuit may generate the target signal $V_{TRGT}$ using a turn-on signal $V_{T-ON}$ generated by a turn-on wave-shaping circuit (e.g., the turn-on wave-shaping circuit 213). The gate drive circuit may shape the turn-on signal $V_{T-ON}$ in order to shape the target signal $V_{TRGT}$. Accordingly, in some examples, the turn-on signal $V_{T-ON}$ may be defined by an "S" shape over the turn-on period $T_{T-ON}$. The gate drive circuit may control the magnitude of the turn-on signal $V_{T-ON}$ to a rated current magnitude $V_{I-RTD}$ (e.g., approximately 7.5 volts) at the end of the turn-on period $T_{T-ON}$. The gate drive circuit may set the target signal $V_{TRGT}$ to be equal to the magnitude of the turn-on signal $V_{T-ON}$ during the turn-on period $T_{T-ON}$. When the step signal $V_{STEP}$ is driven high after the delay period $T_{DELAY}$, the gate drive circuit may set the target signal $V_{TRGT}$ to a predetermined level, such as a maximum current magnitude $V_{I-MAX}$, which may be equal to the magnitude of the step signal $V_{STEP}$ (e.g., approximately 15V). For example, the delay period $T_{DELAY}$ may be approximately equal to the turn-on period $T_{T-ON}$, such that the target voltage signal $T_{TRGT}$ is set to the magnitude of the step signal $V_{STEP}$ after the turn-on period $T_{T-ON}$.

The gate drive circuit may generate a gate control signal $V_{GC}$ based on the target signal $V_{TRGT}$ and a feedback signal $V_{I-FB}$ (not shown) that indicates a magnitude of a load current conducted through the semiconductor switch. The gate drive circuit may adjust a magnitude of the gate control signal $V_{GC}$ in response to the magnitude of the feedback signal $V_{I-FB}$. For example, the gate drive circuit may adjust the magnitude of the gate control signal $V_{GC}$ in response to a magnitude of the feedback signal $V_{I-FB}$ to adjust a magnitude of the load current $I_{LOAD}$ toward a target current, where for example, the target current is indicated by a magnitude of the target signal $V_{TRGT}$.

When the magnitude of the target signal $V_{TRGT}$ is equal to the rated current magnitude $V_{I-RTD}$ at the end of the turn-on period $T_{T-ON}$, the gate drive circuit may control the magnitude of the gate control signal $V_{GC}$ to attempt to control the magnitude of the load current $I_{LOAD}$ to a maximum rated current $I_{RATED}$ (e.g., approximately 10 A). During an inrush current condition (e.g., when the load control device is attempting to charge an input capacitance of the lighting load), the magnitude of the gate control signal $V_{GC}$ may follow the magnitude of the target signal $V_{TRGT}$ as shown in FIG. 8. When the magnitude of the target signal $V_{TRGT}$ is driven up to the maximum current magnitude $V_{I-MAX}$ after the delay period $T_{DELAY}$, the gate drive circuit may control the magnitude of the gate control signal $V_{GC}$ to attempt to control the magnitude of the load current $I_{LOAD}$ to a maximum current level $I_{MAX}$ (e.g., approximately 20 A). Because the lighting load needs to conduct the inrush current during the inrush current event, the magnitude of the gate control signal $V_{GC}$ may be driven up to the maximum current magnitude $V_{I-MAX}$ as shown in FIG. 8. The magnitude of the load current $I_{LOAD}$ may be prevented from exceeding the maximum current level $I_{MAX}$ during the inrush current condition since the target signal $V_{TRGT}$ is maintained at the maximum current magnitude $V_{I-MAX}$. Since the gate drive circuit is using closed-loop control to adjust the magnitude of the gate control signal $V_{GC}$ based on the feedback signal $V_{I-FB}$, the magnitude of the gate control signal $V_{GC}$ may indicate (e.g., be proportional to) the present magnitude of the load current $I_{LOAD}$. As a result, the load current $I_{LOAD}$ may have the same shape as the gate control signal $V_{GC}$ as shown in FIG. 8.

Since the inrush current condition may cause a large amount of current to be conducted through the semiconductor switch, the inrush current condition may appear as an overcurrent condition (e.g., when the lighting load is shorted as shown in FIG. 7). As described above, the gate drive circuit may detect an overcurrent condition using an overcurrent detection circuit (e.g., the overcurrent detection circuit 322). The overcurrent detection circuit may detect the overcurrent condition in response to the gate control signal $V_{GC}$ (e.g., since the magnitude of the gate control signal $V_{GC}$ may indicate present magnitude of the load current $I_{LOAD}$). For example, the overcurrent detection circuit may detect the overcurrent condition when the magnitude of the gate control signal $V_{GC}$ is equal to the maximum current magnitude $V_{I-MAX}$.

The overcurrent protection circuit may determine the length of the trip time period $T_{TRIP}$. In some examples, the length of the trip time period may be fixed or predetermined. In other examples, the length of the trip time period $T_{TRIP}$ may be based on a parameter of the semiconductor switch. For example, the parameter of the semiconductor switch may include a temperature of the semiconductor switch, a power of the semiconductor switch, a voltage developed across the semiconductor switch, and/or the like. The trip time period $T_{TRIP}$ may be inversely proportional to the parameter of the semiconductor switch. For example, the overcurrent protection circuit may be configured to determine the magnitude of the voltage developed across the semiconductor switch in response to a drain voltage signal from a drain voltage sense circuit (e.g., the drain voltage sense circuit). If the magnitude of the voltage developed across the semiconductor switch is high, the trip time period $T_{TRIP}$ may be shorter in comparison to when the voltage developed across the semiconductor switch is low. During an inrush current condition (e.g., when the load control device needs to charge an input capacitance of the lighting load), the voltage developed across the semiconductor switch may be low and the trip time period $T_{TRIP}$ may be long (e.g., longer than the overcurrent condition). As shown in FIG. 8, the magnitude of the load current may decrease away from the maximum current magnitude $V_{I-MAX}$ before the end of the trip time period $T_{TRIP}$, such that the overcurrent protection circuit may not render the semiconductor switch non-conductive for the remainder of the half cycle.

Figure 9:
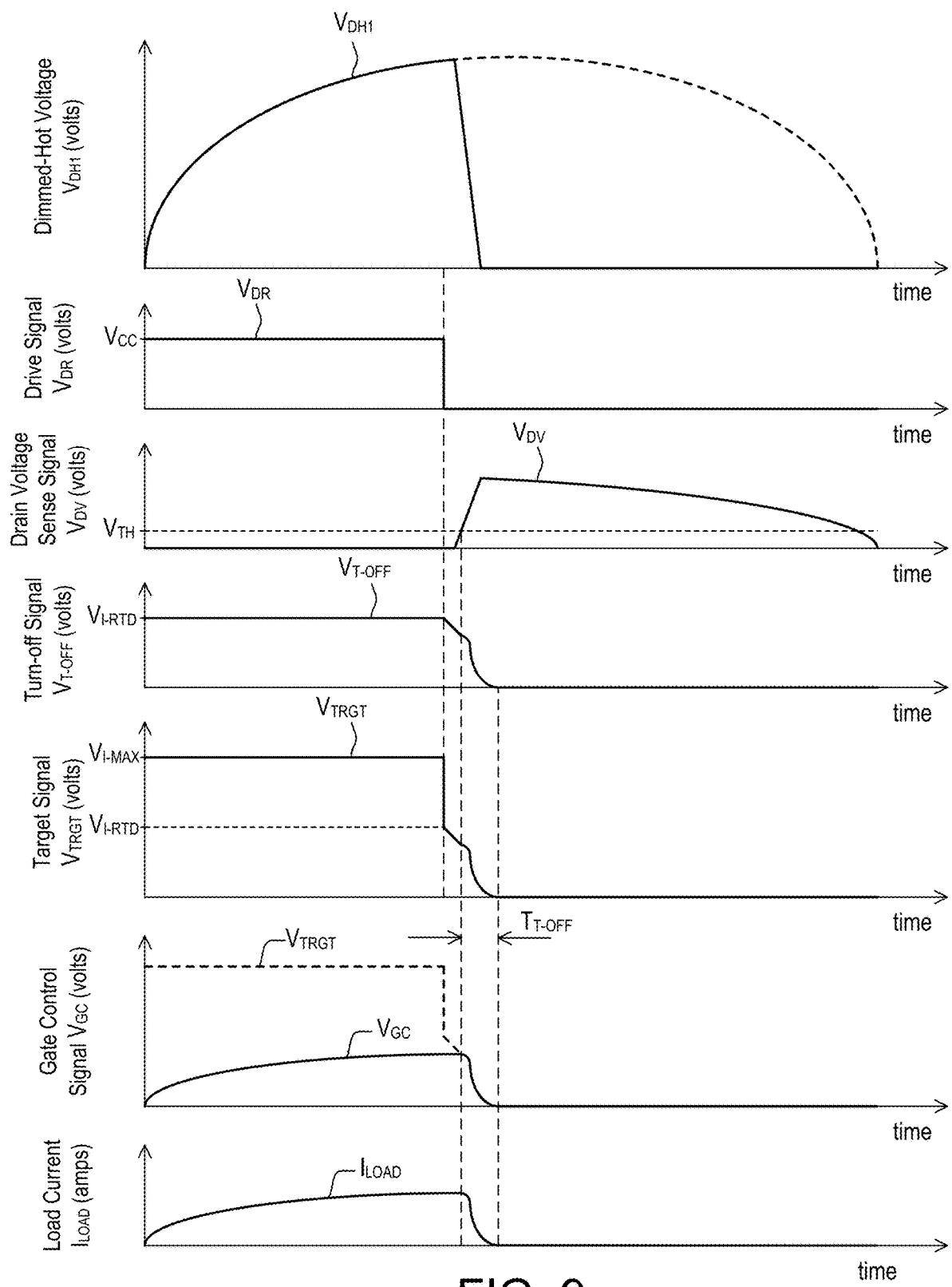
FIG. 9 shows examples of waveforms that illustrate an operation of a gate drive circuit to render a semiconductor switch non-conductive using a reverse phase-control dimming technique.

FIG. 9 shows examples of waveforms that illustrate an operation of a gate drive circuit (e.g., the gate drive circuit 300) to render a semiconductor switch (e.g., the FET Q330) non-conductive using a reverse phase-control dimming technique. A load control device (e.g., the load control device 100 of FIGS. 1 and 2) may receive an AC mains line voltage from an AC power source and may phase control the AC mains line voltage to generate a dimmed-hot voltage $V_{DH}$ (e.g., a phase-control voltage) at a dimmed-hot terminal of the load control device. The load control device may comprise two gate drive circuits with a first gate drive circuit (e.g., the first gate drive circuit 116 shown in FIG. 1) controlling a first semiconductor switch (e.g., the first FET Q112) in the positive half-cycles (e.g., as shown in FIG. 9) and a second gate drive circuit (e.g., the second gate drive circuit 118 shown in FIG. 1) controlling a second semiconductor switch (e.g., the second FET Q114) in the negative half-cycles. The operation of the second gate drive circuit in the negative half cycles may be the same as the operation of the first gate drive circuit in the positive half cycles as shown in FIG. 9. Further, it should be appreciated that the slope of the dimmed-hot voltage $V_{DH1}$ when transitioning to zero as shown in FIG. 9 is exaggerated to illustrate the changes and correlations between the other signals shown in FIG. 9, such as the drain voltage sense signal $V_{DV}$, the turn-off Signal $V_{T-OFF}$, the target signal $V_{TRGT}$, the gate control signal $V_{GC}$, and/or the load current $I_{LOAD}$.

The gate drive circuit of the load control device may receive a drive signal $V_{DR}$ from a control circuit (e.g., the control circuit 115). The control circuit may drive the drive signal $V_{DR}$ high (e.g., towards the DC supply voltage $V_{CC}$) at the beginning of a half-cycle of the AC mains line voltage. The gate drive circuit may generate a target signal $V_{TRGT}$ in response to the drive signal $V_{DR}$ from the control circuit. The control circuit may drive the drive signal $V_{DR}$ low at a firing time $t_{FIRE}$. Prior to the firing time $t_{FIRE}$, a magnitude of the target signal $V_{TRGT}$ may be equal to a maximum current magnitude $V_{I-MAX}$ (e.g., approximately 15V). In response to the control circuit driving the magnitude of the drive signal $V_{DR}$ low at the firing time $t_{FIRE}$, the gate drive circuit may decrease the magnitude of the target signal $V_{TRGT}$ to a predetermined value, such as a rated current magnitude $V_{I-RTD}$, which may be approximately 50% of the maximum current magnitude $V_{I-MAX}$ (e.g., from approximately 15V to 7.5V).

After decreasing the magnitude of the target voltage $V_{TRGT}$ from the maximum current magnitude $V_{I-MAX}$ to the rated current magnitude $V_{I-RTD}$, the gate drive circuit may decrease (e.g., gradually decrease with respect to time) the magnitude of the target signal $V_{TRGT}$ while monitoring a characteristic of (e.g., a voltage developed across) the semiconductor switch. For example, the gate drive circuit may receive a drain voltage sense signal $V_{DV}$ from a drain voltage sense circuit (e.g., the drain voltage sense circuit 328), where the drain voltage sense signal $V_{DV}$ indicates a magnitude of the voltage across the semiconductor switch. When semiconductor switch is conductive, the magnitude of the voltage across the semiconductor switch is substantially small (e.g., approximately zero volts). When the magnitude of the target voltage $V_{TRGT}$ decreases to a point that the semiconductor switch begins to become non-conductive, the magnitude of the voltage across the semiconductor switch may begin to increase causing the magnitude of the drain voltage sense signal $V_{DV}$ to increase as shown in FIG. 9. The gate current sense circuit may determine when the magnitude of the drain voltage sense signal $V_{DV}$ exceeds a drain voltage threshold $V_{TH}$ (e.g., approximately 1V).

When the gate drive circuit detects that the voltage developed across the semiconductor switch has started to increase in magnitude such that the magnitude of the drain voltage sense signal $V_{DV}$ exceeds the drain voltage threshold $V_{TH}$, the gate drive circuit may begin to shape the target signal $V_{TRGT}$ from a present value towards zero volts, for example, as shown in FIG. 9. The gate drive circuit may shape the target signal $V_{TRGT}$ over a turn-off period $T_{T-OFF}$ (e.g., approximately 40 μsec). The gate drive circuit may generate the target signal $V_{TRGT}$ using a turn off signal $V_{T-OFF}$ generated by a turn-off wave-shaping circuit (e.g., the turn-off wave-shaping circuit 314). Accordingly, the gate drive circuit may use the drain voltage sense signal $V_{DV}$ as a trigger for the gate drive circuit to begin wave-shaping the turn-off signal $V_{T-OFF}$ (e.g., and also the target signal $V_{TGRT}$). Alternatively, the gate drive circuit may wave-shape the target signal $V_{TRGT}$ irrespective of the magnitude of the drain voltage sense signal $V_{DV}$. For example, the gate drive circuit may shape the target signal $V_{TRGT}$ after (e.g., immediately after) the magnitude of the target signal $V_{TRGT}$ is decreased from the maximum current magnitude $V_{I-MAX}$ to the rated current magnitude $V_{I-RTD}$. The gate drive circuit may shape the turn-off signal $V_{T-OFF}$ (e.g., and also the target signal $V_{TRGT}$) in a preconfigured shape, such as a S-shape, based on the magnitude of the drain voltage sense signal $V_{DV}$. The gate drive circuit may shape the turn-off signal $V_{T-OFF}$ in a first shape during a first portion of the turn-off period $T_{T-OFF}$, and shape the turn-off signal $V_{T-OFF}$ in a second shape during a second portion of the turn-off period $T_{T-OFF}$ (e.g., to create the S-shape).

The gate drive circuit may generate a gate control signal $V_{GC}$ based on the target signal $V_{TRGT}$ and a feedback signal $V_{I-FB}$ (not shown) that indicates a magnitude of a load current conducted through an electrical load as described herein. As described herein, the gate drive circuit may adjust a magnitude of the gate control signal $V_{GC}$ in response to a magnitude of the feedback signal $V_{I-FB}$. For example, as shown in FIG. 9, the gate drive circuit may adjust the magnitude of the gate control signal $V_{GC}$ in response to the magnitude of the feedback signal $V_{I-FB}$, and thereby, adjust a magnitude of the load current $I_{LOAD}$ toward a target current. The gate drive circuit may render the semiconductor switch non-conductive by adjusting the magnitude of the gate control signal $V_{GC}$ to zero volts, and thereby, controlling the magnitude of the load current through the electrical load to zero amps. Since the gate drive circuit is using closed-loop control to adjust the magnitude of the gate control signal $V_{GC}$ based on the feedback signal $V_{I-FB}$, the magnitude of the gate control signal $V_{GC}$ may indicate (e.g., be proportional to) the present magnitude of the load current $I_{LOAD}$. As a result, the load current $I_{LOAD}$ may have the same shape as the gate control signal $V_{GC}$ as shown in FIG. 9.

Figure 10:
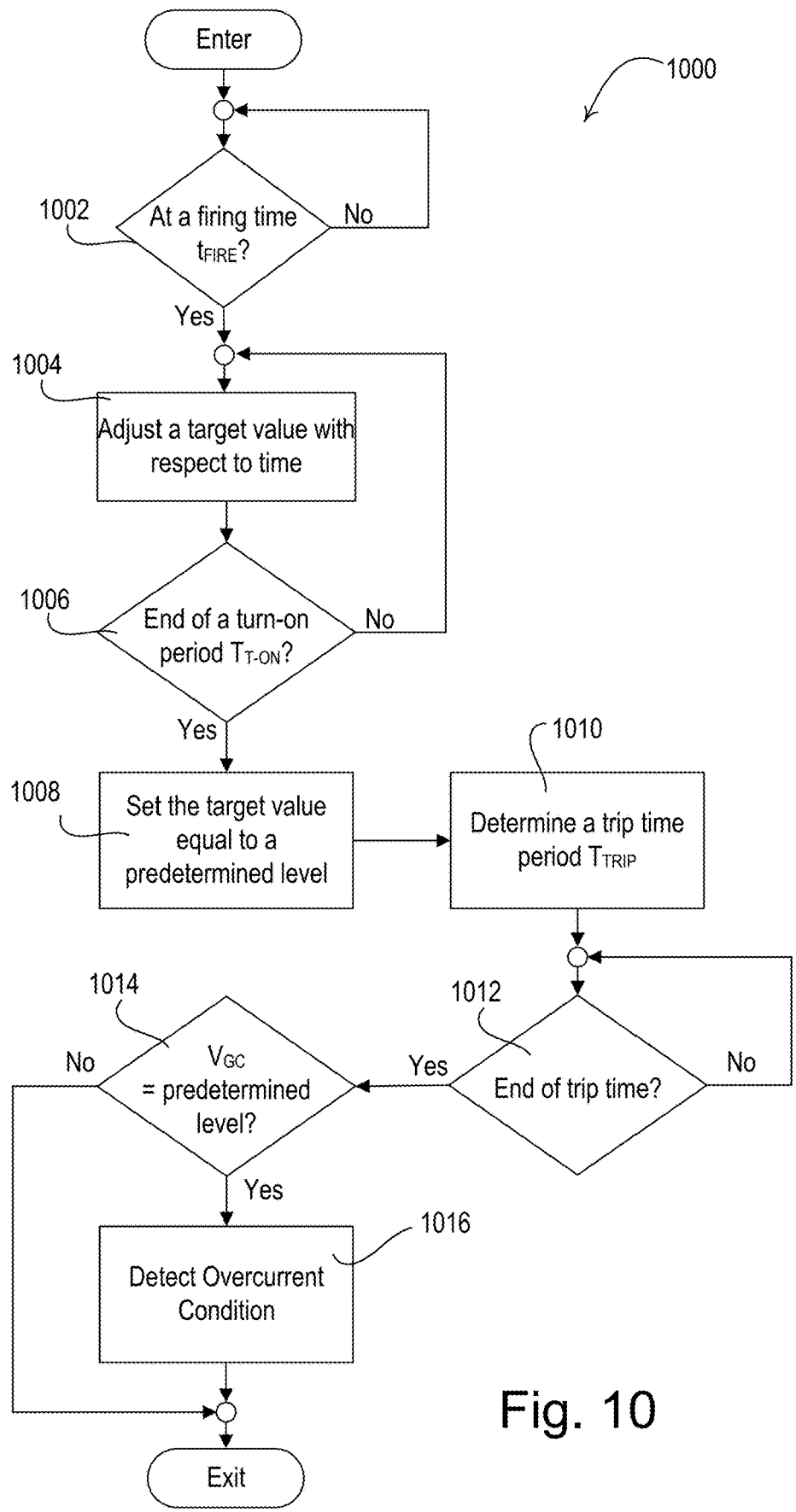
FIG. 10 is a flowchart of an example control procedure that may be executed by a load control device.

FIG. 10 is a flowchart of an example control procedure 1000 that may be executed by a load control device. For example, the control procedure 1000 may be performed by the load control device 100 (e.g., a dimmer switch) for controlling the amount of power delivered from an AC power source to one or more electrical loads, such as lighting loads 102, 103. The control procedure 1000 may be performed by any combination of a control circuit (e.g., the control circuit 115 and/or a control circuit that is part of and/or dedicated to a gate drive circuit, such as the gate drive circuit 116, 118, 126, 128, and/or 300) and/or analog circuitry (e.g., a gate drive circuit, such as the gate drive circuit 116, 118, 126, 128, and/or 300). For instance, in some examples, the load control device may include multiple control circuits, such as a control circuit that is dedicated to a gate drive circuit. In such examples, the control procedure 1000 may be performed by one or any combination of a general control circuit (e.g., the control circuit 115), a gate drive control circuit, and/or analog circuitry of the load control device. The load control device may execute the control procedure periodically, such as within each half-cycle of an AC mains line voltage received from the AC power source. Further, although illustrated as including 1002-1012, a load control device may perform any combination of 1002-1012 when performing the control procedure 1000 (e.g., any combination of 1002-1012 may be omitted).

When executing the control procedure 1000, the load control device may be operating using a forward-phase control technique. When operating using a forward phase control technique, the load control device may render (e.g., begin to render) the semiconductor switch conductive at a firing time $t_{FIRE}$ (e.g., at a firing angle) relative to the zero-crossing points of the AC mains line voltage $V_{AC}$ (e.g., as determined from the zero-cross signal) to generate a phase-control dimmed-hot voltage $V_{PC}$. The load control device may be configured to determine and/or adjust the firing time $t_{FIRE}$ (e.g., a phase angle) of a semiconductor switch (e.g., of a controllably conductive device) each half cycle to control the amount of power delivered to the electrical, for example, to control the intensity of a lighting load toward a target intensity.

At 1002, the load control device may determine whether the time during a present half-cycle of AC mains line voltage is at a firing time $t_{FIRE}$ relative to the zero-crossing points. If the time during the present half-cycle of AC mains line voltage is not at the firing time $t_{FIRE}$, then the load control device may wait. Once the load control device determines that the time during the present half-cycle of AC mains line voltage is at the firing time $t_{FIRE}$ at 1002, the load control device may adjust (e.g., generate) a target value (e.g., a value of the target signal $V_{TRGT}$) over a period of time (e.g., a turn-on period $T_{T-ON}$) at 1004. For example, the load control device may adjust (e.g., shape) the target value over the period of time (e.g., a turn-on period $T_{T-ON}$) by adjusting a magnitude of the target value with respect to time over the period of time using, for example, preconfigured shape, such as an S-shape. When the load control device generates the target value, this may cause the load control device to render the semiconductor switch conductive at the firing time during a half-cycle of the AC power source using the forward phase control technique. For example, the load control device may generate a gate control signal for controlling an impedance of the semiconductor switch when the semiconductor switch is conductive. The load control device may also receive a first feedback signal (e.g., the feedback signal $V_{I-FB}$) that is indicative of a magnitude of the load current conducted through the semiconductor switch, and may adjust a magnitude of the gate control signal in response to the first feedback signal to control the magnitude of the load current towards the target value (e.g., determined by the target signal $V_{TRGT}$).

At 1006, the load control device may determine whether the turn-on period $T_{T-ON}$ is over. If it is not at the end of the turn-on period $T_{T-ON}$, the load control device may continue to determine or adjust the target value at 1004. If the load control device determines that the turn-on period $T_{T-ON}$ is over at 1006, the load control device may set the target value equal to a predetermined level at 1008. The predetermined level may be a maximum current value (e.g., the maximum current magnitude $V_{I-MAX}$). At 1010, the load control device may determine a trip time period $T_{TRIP}$. In some examples, the length of the trip time period may be fixed or predetermined. In other examples, the length of the trip time period $T_{TRIP}$ may be based on a parameter of the semiconductor switch. For example, the length of the trip time period may be based on any combination of a temperature of the semiconductor switch, a power of the semiconductor switch, a voltage developed across the semiconductor switch, and/or the like. For example, the load control device may receive a second feedback signal that may indicate the characteristic of the semiconductor switch, such as a magnitude of the voltage developed across the semiconductor switch (e.g., the drain voltage sense signal $V_{DV}$). The trip time period $T_{TRIP}$ may be inversely proportional to the parameter of the semiconductor switch.

At 1012, the load control device may determine whether the trip time period $T_{TRIP}$ is over. If the trip time period $T_{TRIP}$ is not over at 1012, the load control device may wait. If the trip time period $T_{TRIP}$ is over at 1012, the load control device may determine whether the magnitude of the gate control signal $V_{GC}$ is equal to the predetermined level (e.g., equal to the maximum current value or the maximum current magnitude $V_{I-MAX}$), or otherwise stated, is equal to the target value, at 1014. If the load control device determines that the magnitude of the gate control signal $V_{GC}$ is not equal to the predetermined level at the end of the trip time period $T_{TRIP}$ at 1014, the control procedure 1000 may exit (e.g., such that the load control device may continue to generate the gate control signal to control the impedance of the semiconductor switch in response to the target value and the first feedback signal). For example, the magnitude of the gate control signal $V_{GC}$ may deviate from the magnitude of the predetermined level or target value (e.g., as shown in FIG. 6). For example, the magnitude of the gate control signal $V_{GC}$ may not be driven up to the maximum current magnitude $V_{I-MAX}$ as shown in FIG. 6.

If the load control device determines that the gate control signal $V_{GC}$ is equal to the predetermined level at the end of the trip time period $T_{TRIP}$ at 1014, the load control device may detect an overcurrent condition at 1016. In response to detecting an overcurrent condition, the load control device may perform any combination of actions. For example, the load control device may decrease the magnitude of the gate control signal $V_{GC}$ to zero volts, render the semiconductor switch non-conductive, alter a user of the overcurrent condition, etc. For example, the load control device may control the magnitude of the target value or the gate control signal $V_{GC}$ to turn off the semiconductor switch directly or using an overcurrent protection circuit (e.g., the overcurrent protection circuit 324). Accordingly, the load control device may maintain the semiconductor switch conductive during the duration of the trip time period $T_{TRIP}$ and render the semiconductor switch non-conductive at the conclusion of the trip time period $T_{TRIP}$ if an overcurrent condition is detected. For instance, in response to detecting an overcurrent condition and at the end of the trip time period $T_{TRIP}$, the load control device may decrease (e.g., quickly decrease) the magnitude of the gate control signal $V_{GC}$ to zero volts (e.g., in response to controlling the magnitude of the target signal $V_{TRGT}$ to zero volts), thereby rendering the semiconductor switch non-conductive.

Figure 11:
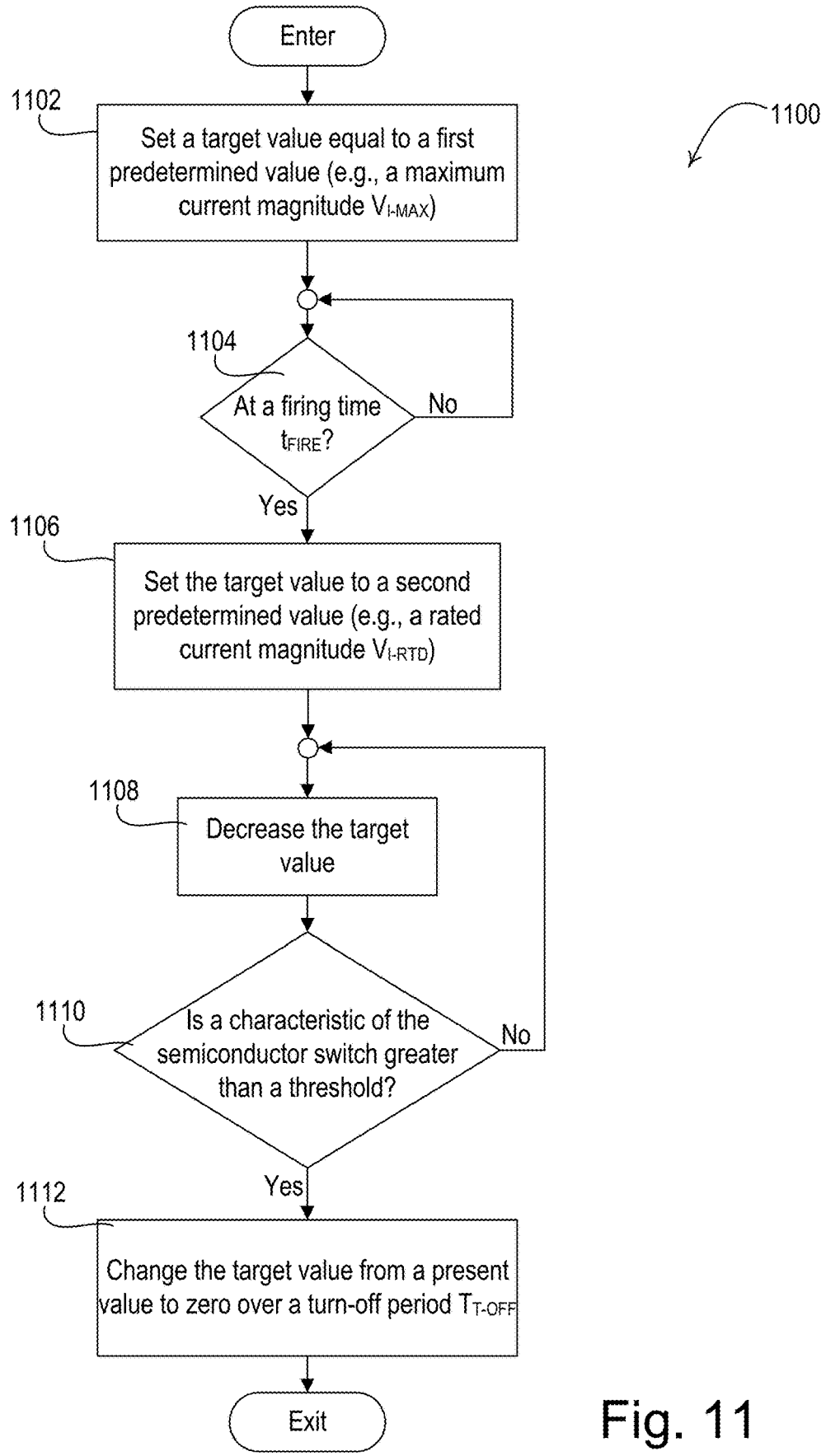
FIG. 11 is a flowchart of an example control procedure that may be executed by a load control device.

FIG. 11 is a flowchart of an example control procedure 1100 that may be executed by a load control device. For example, the control procedure 1100 may be performed by the load control device 100 (e.g., a dimmer switch) for controlling the amount of power delivered from an AC power source to one or more electrical loads, such as lighting loads 102, 103. The control procedure 1100 may be performed by any combination of a control circuit (e.g., the control circuit 115 and/or a control circuit that is part of and/or dedicated to a gate drive circuit, such as the gate drive circuit 116, 118, 126, 128, and/or 300) and/or analog circuitry (e.g., a gate drive circuit, such as the gate drive circuit 116, 118, 126, 128, and/or 300). For instance, in some examples, the load control device may include multiple control circuits, such as a control circuit that is dedicated to a gate drive circuit. In such examples, the control procedure 1100 may be performed by one or any combination of a general control circuit (e.g., the control circuit 115), a gate drive control circuit, and/or analog circuitry of the load control device. The load control device may execute the control procedure periodically, such as within each half-cycle of an AC mains line voltage received from the AC power source. Further, although illustrated as including 1102-1112, a load control device may perform any combination of 1102-1112 when performing the control procedure 1100 (e.g., any combination of 1102-1112 may be omitted).

When executing the control procedure 1100, the load control device may be operating using a reverse-phase control technique. When using a reverse phase-control dimming technique, the load control device may render a semiconductor switch conductive (e.g., to cause the controllably conductive device to be conductive) at the beginning of each half cycle of the AC mains line voltage, and then render (e.g., begin to render) the semiconductor switch non-conductive (e.g., to cause the controllably conductive devices 110, 120 to be non-conductive) at a firing time $t_{FIRE}$ (e.g., at a firing angle) during the half cycle after which the controllably conductive device may remain non-conductive until the end of the half cycle. The load control device may be configured to determine and/or adjust the firing time $t_{FIRE}$ (e.g., a phase angle) of a semiconductor switch (e.g., of a controllably conductive device) each half cycle to control the amount of power delivered to the electrical, for example, to control the intensity of a lighting load toward a target intensity.

At 1102, the load control device may set a target value (e.g., a value of the target signal $V_{TRGT}$) equal to a first predetermined level (e.g., a maximum current magnitude $V_{I-MAX}$), which for example, may begin at the beginning of each half cycle of the AC mains line voltage. In some examples, the maximum current magnitude $V_{I-MAX}$ may be approximately 15 volts. The load control device may generate a gate control signal $V_{GC}$ for controlling an impedance of the semiconductor switch when the semiconductor switch is conductive, for example, in response to the target value being set (e.g., to the first predetermined level). For example, the load control device may receive a first feedback signal (e.g., the feedback signal $V_{I-FB}$) that is indicative of a magnitude of the load current conducted through the semiconductor switch, and may adjust a magnitude of the gate control signal $V_{GC}$ in response to the first feedback signal to control the magnitude of the load current towards a target value (e.g., determined from the values of the target signal $V_{TRGT}$). At 1104, the load control device may determine whether the time during a present half-cycle of AC mains line voltage is at a firing time $t_{FIRE}$. If the time during the present half-cycle of AC mains line voltage is not at the firing time $t_{FIRE}$, at 1104, the load control device may wait.

If the time during the present half-cycle of AC mains line voltage is at the firing time $t_{FIRE}$ at 1104, the load control device may set the target value to a second predetermined value (e.g., a rated current magnitude $V_{I-RTD}$) at the firing time $t_{FIRE}$ at 1106. In some examples, the rated current magnitude $V_{I-RTD}$ may be approximately 7.5 volts. Further, in some examples, the load control device may not set the target value to the second predetermined value at 1106, and 1106 may be omitted from the control procedure 1100. At 1108, the load control device may decrease the target value. For example, the load control device may decrease (e.g., linearly decrease) the target value with respect to time from the second predetermined value to an intermediate value, for example while a second feedback signal is above or below a threshold. The second feedback signal may indicate a characteristic of the semiconductor switch, such as a magnitude of a voltage developed across the semiconductor switch (e.g., the drain voltage sense signal $V_{DV}$).

At 1110, the load control device may determine whether the characteristics of the semiconductor switch is greater than a threshold (e.g., the drain voltage threshold $V_{TH}$). If the load control device determines that the characteristics of the semiconductor switch is less than the threshold at 1110, the load control device may wait. If the load control device determines that the characteristics of the semiconductor switch is greater than the threshold at 1110, the load control device may change the target value from a present value to zero over a turn-off period $T_{T\text{-}OFF}$ at 1112. The present value may be the value of the target value when the second feedback signal exceeds the threshold. For example, the load control device may shape the target value with respect to time (e.g., in accordance with an S-shape) during the turn-off period from the present value (e.g., intermediate value) to zero in response to the second feedback signal exceeding the threshold.

The load control device may generate the gate control signal $V_{GC}$ based on the target value and the second feedback signal, for example, during the turn-off period. As the load control device changes the target value from the present value to zero at 1112, the load control device may control the impedance of the semiconductor switch until the semiconductor switch is rendered non-conductive (e.g., when the target value is zero and the gate control signal $V_{GC}$ is zero volts), which thereby, controls the magnitude of the load current through the electrical load to zero amps. Since the load control device is using closed-loop control to adjust the magnitude of the gate control signal $V_{GC}$ based on the first feedback signal, the magnitude of the gate control signal $V_{GC}$ may indicate (e.g., be proportional to) the present magnitude of the load current $I_{LOAD}$. Finally, the control procedure 1100 may be used to accommodate lower load currents due to load ratings and/or dimming angles. The control procedure 1100 may provide a smooth transition from an on-state to a gradual off-state, which may improves the EMC performance of the load control device.

What is claimed is:

1. A load control device configured to control power delivered from an AC power source to an electrical load, the load control device comprising:
    a hot terminal adapted to be electrically coupled to a hot side of the AC power source;
    a dimmed-hot terminal adapted to be electrically coupled to the electrical load;
    a controllable conductive device coupled between the hot terminal and the dimmed-hot terminal, such that the controllable conductive device is adapted to be coupled in series with the electrical load, the controllable conductive device comprising a semiconductor switch configured to conduct a load current through the electrical load;
    a control circuit configured to generate a drive signal; and
    a closed-loop gate drive circuit configured to receive a feedback signal that is indicative of a magnitude of the load current conducted through the semiconductor switch, and configured to generate a gate control signal in response to the drive signal and the feedback signal, wherein the gate control signal is configured to control the semiconductor switch for controlling the magnitude of the load current conducted through the electrical load;
    wherein the closed-loop gate drive circuit comprises an overcurrent protection circuit that is configured to detect an overcurrent condition in the semiconductor switch in response to the drive signal and the feedback signal, and configured to control the gate control signal in response to detecting the overcurrent condition.

2. The load control device of claim 1, wherein the closed-loop gate drive circuit is configured to:
    shape a target signal by adjusting a magnitude of the target signal over time during a turn-on period of the semiconductor switch in response to the drive signal; and
    generate the gate control signal in response to the target signal and the feedback signal that indicates the magnitude of the load current conducted through the semiconductor switch.

3. The load control device of claim 1, wherein the closed-loop gate drive circuit comprises:
    a turn-on wave-shaping circuit configured to shape a target signal with a first shape during a first portion of a turn-on period in response to the drive signal, and shape the target signal with a second shape during a second portion of the turn-on period in response to the drive signal; and
    wherein the first closed-loop gate drive circuit is configured to generate the gate control signal in response to the target signal and the feedback signal that indicates the magnitude of the load current through the semiconductor switch.

4. The load control device of claim 1, wherein the closed-loop gate drive circuit configured to:
    adjust a magnitude of a target signal over time during a turn-on period of the semiconductor switch in response to the drive signal to control a magnitude of the feedback signal towards the target signal;
    receive a step signal a predetermined time delay after receiving the drive signal from the control circuit;
    set the magnitude of the target signal to a magnitude of the step signal upon receiving the step signal; and
    generate the gate control signal in response to the target signal and the feedback signal that indicates the magnitude of the load current conducted through the semiconductor switch.

5. The load control device of claim 4, wherein the magnitude of the step signal is equal to a magnitude of the drive signal.

6. The load control device of claim 1, wherein the closed-loop gate drive circuit is configured to:
    generate an overcurrent signal in response to an overcurrent detection circuit detecting the overcurrent condition in the semiconductor switch; and
    render the semiconductor switch non-conductive by controlling the drive signal to zero volts.

7. The load control device of claim 1, wherein the overcurrent protection circuit is configured to determine a parameter associated with the semiconductor switch, and set a trip time period for the semiconductor switch based on the parameter; and
    wherein the closed-loop gate drive circuit is configured to control a magnitude of the gate control signal to render the semiconductor switch non-conductive based on an expiration of the trip time period.

8. The load control device of claim 7, wherein the parameter associated with the semiconductor switch comprises one or more of a temperature across the semiconductor switch, a power of the semiconductor switch, or a drain voltage developed across the semiconductor switch.

9. The load control device of claim 7, wherein the overcurrent protection circuit is configured to determine the parameter associated with the semiconductor switch based on detecting a drain voltage developed across the semiconductor switch via a drain voltage sense circuit coupled in series with the semiconductor switch.

10. The load control device of claim 9, wherein the trip time period is inversely proportional to the drain voltage developed across the semiconductor switch.

11. The load control device of claim 7, wherein the trip time period is based on a duration that the load current conducted through the semiconductor switch is equal to a predetermined level.

12. The load control device of claim 1, wherein the overcurrent protection circuit is configured to send a reset signal to the closed-loop gate drive circuit upon reaching on a next half cycle of an AC mains line voltage received from the AC power source.

13. The load control device of claim 1, wherein the closed-loop gate drive circuit comprises the overcurrent protection circuit and a voltage amplifier circuit; and
wherein the overcurrent protection circuit is configured to control an input of the voltage amplifier circuit based on the detection of the overcurrent condition in the semiconductor switch.

14. The load control device of claim 2, wherein the gate control signal is configured to render the semiconductor switch fully conductive at an end of the turn-on period.

15. A method for detecting an overcurrent condition in a load control device that is configured to control power delivered from an AC power source to an electrical load, the method comprising:
generating a target signal in response to a drive signal received from a control circuit;
receiving a feedback signal indicative of a magnitude of a load current conducted through a semiconductor switch, wherein the semiconductor switch is configured to conduct the load current through the electrical load;
generating a gate control signal based on the feedback signal and the target signal, the gate control signal for controlling the semiconductor switch to control the magnitude of the load current through the electrical load; and
detecting an overcurrent condition in the semiconductor switch in response to the gate control signal.

16. The method of claim 15, further comprising:
decreasing the magnitude of the gate control signal to zero volts in response to detecting the overcurrent condition.

17. The method of claim 15, further comprising:
rendering the semiconductor switch non-conductive in response to detecting the overcurrent condition.

18. The method of claim 15, further comprising:
alerting a user of the overcurrent condition in response to detecting the overcurrent condition.

19. The method of claim 15, further comprising:
adjusting a magnitude of the target signal with respect to time within a turn-on period.

20. The method of claim 19, further comprising:
setting the target signal equal to a predetermined level at the end of the turn-on period; and
detecting the overcurrent condition in the semiconductor switch when a magnitude of the gate control signal is equal to the predetermined level.

21. The method of claim 20, further comprising:
rendering the semiconductor switch non-conductive when the magnitude of the gate control signal is equal to the predetermined level for a length of a trip time period after the overcurrent condition is detected.

22. The method of claim 21, wherein the length of the trip time period is based on a parameter of the semiconductor switch.

23. The method of claim 22, wherein the parameter of the semiconductor switch comprises one or more of a temperature across the semiconductor switch, a power of the semiconductor switch, or a voltage developed across the semiconductor switch.

24. The method of claim 22, wherein the length of the trip time period is inversely proportional to a value of the parameter of the semiconductor switch.

25. The method of claim 15, further comprising:
adjusting a magnitude of the gate control signal in response to a magnitude of the feedback signal to adjust the magnitude of the load current towards a target current indicated by a magnitude of the target signal.

26. The method of claim 15, further comprising:
shaping the target signal by adjusting a magnitude of the target signal with respect to time during a turn-on period in response to the drive signal;
receiving a step signal a predetermined time delay after receiving the drive signal from the control circuit; and
setting the magnitude of the target signal to a magnitude of the step signal upon the reception of the step signal.

* * * * *